(12) United States Patent
Yang

(10) Patent No.: US 10,726,923 B2
(45) Date of Patent: Jul. 28, 2020

(54) BIAS SCHEME FOR DUMMY LINES OF DATA STORAGE DEVICES

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 16/198,593

(22) Filed: Nov. 21, 2018

(65) Prior Publication Data

US 2020/0160914 A1   May 21, 2020

(51) Int. Cl.
| | |
|---|---|
| *G11C 16/10* | (2006.01) |
| *G11C 16/04* | (2006.01) |
| *G11C 16/28* | (2006.01) |
| *G11C 11/56* | (2006.01) |

(Continued)

(52) U.S. Cl.
CPC ......... *G11C 16/10* (2013.01); *G11C 11/5628* (2013.01); *G11C 11/5671* (2013.01);
(Continued)

(58) Field of Classification Search
CPC ......... G11C 16/10; G11C 16/28; G11C 16/24; G11C 11/5671; G11C 11/5628; G11C 16/0483; H01L 27/11524; H01L 27/11556; H01L 27/11582; H01L 27/1157; H01L 27/11519; H01L 27/11565
See application file for complete search history.

(56) References Cited

U.S. PATENT DOCUMENTS

| | | |
|---|---|---|
| 6,185,131 B1 | 2/2001 | Kouchi |
| 8,976,592 B2 * | 3/2015 | Park ................ G11C 16/28 365/185.17 |

(Continued)

FOREIGN PATENT DOCUMENTS

| | | |
|---|---|---|
| JP | 2013008419 A | 1/2013 |
| JP | 5711481 | 4/2015 |

(Continued)

OTHER PUBLICATIONS

N. Otsuka, M.A. Horowitz, "Circuit techniques for 1.5-V power supply flash memory," IEEE Journal of Solid-State Circuits, vol. 32, Issue: 8, Aug 1997.

*Primary Examiner* — David Lam
(74) *Attorney, Agent, or Firm* — Vierra Magen Marcus LLP

(57) ABSTRACT

Systems and methods reduce latency during read-verify and programming operations by biasing a dummy line next to a neighboring bit line with an over-drive voltage during a first period and then biasing the dummy line to a same voltage as that of the neighboring bit line during a second period that contiguously follows the first period. The dummy line may be biased based on a state of the neighboring bit line. For example, a first dummy line is first charged to an over-drive voltage and then charged to the same voltage as that of a first neighboring bit line, and a second dummy line at an opposing edge is first charged to the over-drive voltage and then charged to the same voltage as that of a second neighboring bit line. This biasing scheme using the dummy lines helps reduce capacitive loading for neighboring bit lines during ready-verify and programming operations.

20 Claims, 12 Drawing Sheets

(51) Int. Cl.
*G11C 16/24* (2006.01)
*H01L 27/11565* (2017.01)
*H01L 27/11524* (2017.01)
*H01L 27/1157* (2017.01)
*H01L 27/11556* (2017.01)
*H01L 27/11582* (2017.01)
*H01L 27/11519* (2017.01)

(52) U.S. Cl.
CPC .......... *G11C 16/0483* (2013.01); *G11C 16/24* (2013.01); *G11C 16/28* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(56) References Cited

U.S. PATENT DOCUMENTS

| | | |
|---|---|---|
| 9,147,440 B2 | 9/2015 | Kim et al. |
| 2007/0058413 A1 | 3/2007 | Lin et al. |
| 2008/0101143 A1 | 5/2008 | Seong-Ook et al. |
| 2011/0085385 A1 | 4/2011 | Park et al. |
| 2017/0278578 A1* | 9/2017 | Nagai .................... G11C 16/10 |
| 2019/0088587 A1* | 3/2019 | Takekida .............. H01L 23/528 |

FOREIGN PATENT DOCUMENTS

| | | |
|---|---|---|
| KR | 20070101909 A | 10/2007 |
| KR | 20100071211 A | 6/2010 |

\* cited by examiner

FIG. 7D
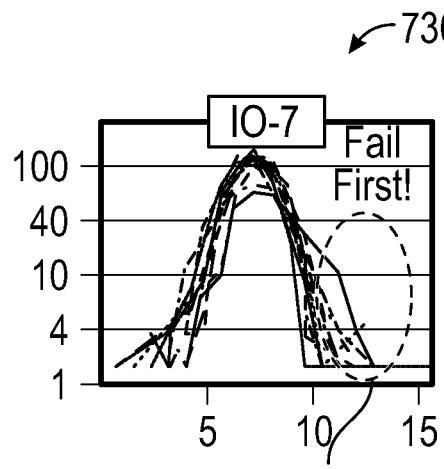
Tier 15, IO-7, EvenByte
FIG. 7E
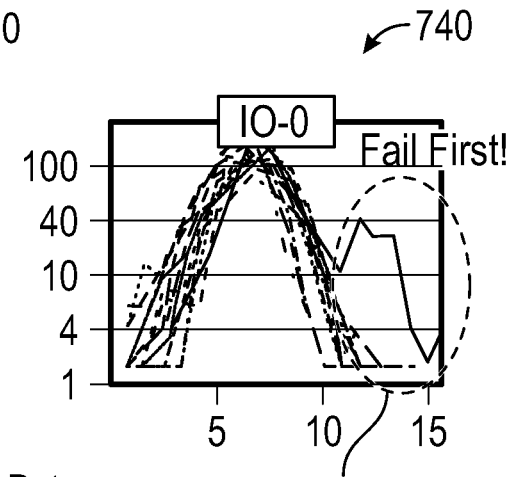
Tier 0, IO-0, EvenByte
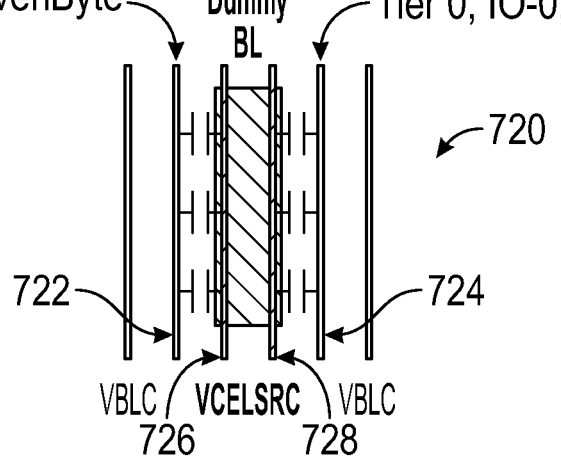
FIG. 7C ized as a description of various configurations of the subject technology and is not intended to represent the only configurations

BIAS SCHEME FOR DUMMY LINES OF DATA STORAGE DEVICES

BACKGROUND

The present description relates generally to data storage devices and methods, including, without limitation, a bias scheme for dummy lines of data storage devices.

Flash memory enjoys a number of advantages over other types of storage devices. Flash memory generally offers faster read access times and better shock resistance than a hard disk drive (HDD). Unlike dynamic random access memory (DRAM), flash memory is non-volatile, meaning that data stored in a flash storage device is not lost when power to the device is removed. These advantages, and others, may explain the increasing popularity of flash memory for storage applications in devices such as memory cards, USB flash drives, mobile phones, digital cameras, mass storage devices, MP3 players and the like.

Flash memory utilizes memory cells (e.g., single-level cells (SLC), multi-level cells (MLC), triple-level cells (TLC) and/or quadruple-level cells (QLC)) to store data as electrical values, such as electrical charges or voltages. As flash memory continues to grow in storage density to meet increasing demand for data storage, flash memory designs have continued to grow in complexity to adapt to the expected reliability and endurance of MLC, TLC, QLC, and even higher density memory cells. The speed of storage operations in flash memory is an important metric for performance of flash memory.

BRIEF DESCRIPTION OF THE DRAWINGS

Certain features of the subject technology are set forth in the appended claims. However, for purpose of explanation, several embodiments of the subject technology are set forth in the following figures.

FIGS. 7A-7E illustrate examples of biasing levels that produce capacitive coupling on data bit lines.

DETAILED DESCRIPTION

Figure 1:
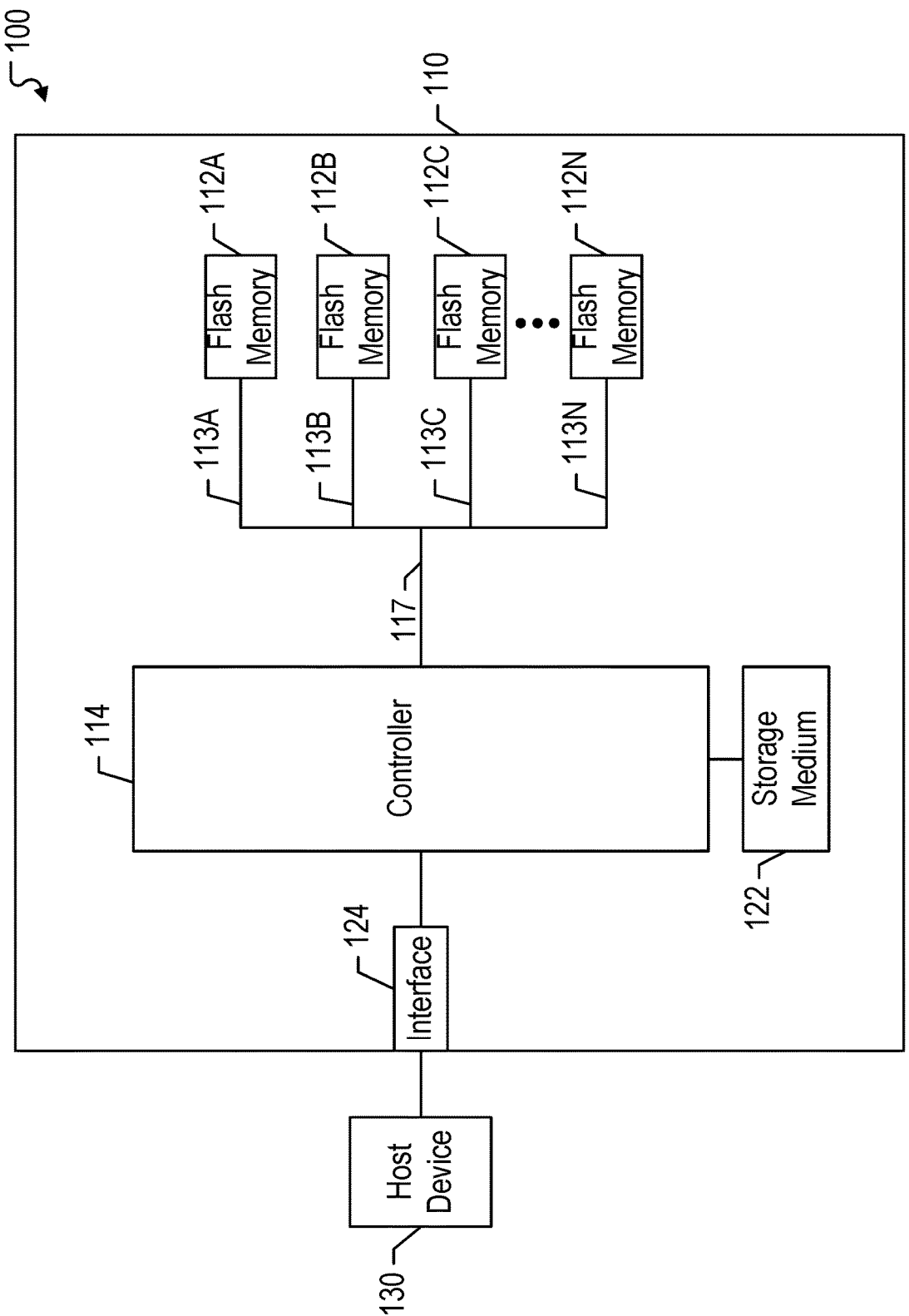
FIG. 1 illustrates an example of a computer system in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

Flash memory devices utilize memory cells (e.g., SLC, MLC, and/or TLC) to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value. In some implementations, a charge-storing material such as a charge-trapping material can be used in such memory devices to store a charge which represents a data state. The charge-trapping material can be arranged vertically in a three-dimensional (3D) stacked memory structure, or horizontally in a two-dimensional (2D) memory structure. One example of a 3D memory structure is a Bit Cost Scalable (BiCS) architecture, which comprises a stack of alternating conductive and dielectric layers.

In some flash memory devices, memory cells are joined to one another in an array, such as in NAND strings in a block or sub-block. Each NAND string includes a number of memory cells connected in series, including a first set of memory cells on a drain-side of the NAND string that is connected to a bit line, and a second set of memory cells on a source-side of the NAND string that is connected to a source line. The first set of memory cells may be coupled to one or more drain-side select gate transistors (SGD transistors). The second set of memory cells may be coupled to one or more source-side select gate transistors (SGS transistors). Further, the memory cells can be arranged with a common control line (e.g., word line) which acts as a control gate. A set of word lines extends from the source side of a block to the drain side of a block.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after one or more programming passes to determine whether the memory cells have completed programming. Read operations may be performed as part of the verify operations and/or as separate reading operations with the memory cells.

Each memory cell may be associated with a data state according to write data in a program command. Based on its data state, a memory cell may either remain in the erased state or be programmed to a data state (a programmed data state) different from the erased state. For example, in a three-bit per cell memory device, there are eight data states including the erased state and seven higher data states referred to as the A, B, C, D, E, F and G data states (see FIG. 6).

In 3D NAND architecture, there may be a periodic region referred to as a "shunt region," which is used to deliver a source line voltage (e.g., CELSRC) to each individual block of memory (or memory cells). The shunt region may be a structure that repeats at a regular interval (e.g., every 3072 regular sense lines, or every 1536 regular sense lines). Due to process requirements, such as keeping lithography periodicity, dummy lines, which have no data access, may be placed over the shunt regions.

The manner in how to bias these dummy lines becomes critical. The dummy lines are found to be one of the read performance limiters. In some approaches, the dummy lines above a shunt region are biased at the source line voltage (e.g., VCELSRC). In other approaches, the dummy lines are biased at a floating level. In either case, these biasing levels create a large capacitance loading at neighboring sense lines (e.g., Tier 0, IO-1 and Tier 15, IO-7) next to dummy lines (e.g., by creating a strong dummy-bit-line-to-regular-data-bit-line capacitive coupling), which slows down the edge sense line charging speeds during a read/verify operation. These bits become the bottleneck of read performance, especially read operations clocked by the R-clock, namely the read clock. In short, these edge sense lines are among the first to fail during read/verify operations.

By utilizing BiCS memory, or generally referred to as 3D NAND memory, if two neighboring lines (e.g., one regular sense line and one adjacent dummy line) are fully at ground potential (e.g., VCELSRC), then the timing margin in the sense line timing can be reduced by about 5 μs. Therefore, if one neighboring dummy line is grounded, then the timing margin can be reduced by about 2.5 μs (or half of the 2-neighbor sense line timing scenario).

The subject technology provides for a bias scheme for dummy lines. For example, during a read and verify operation, dummy lines can be biased at a same voltage as regular sense lines (e.g., VBLC). In another example, the dummy lines can be first biased with an over-drive/kick voltage (e.g., VBLC+Δ), then biased back to the same voltage as the regular sense lines (e.g., VBLC). This bias scheme can accelerate read speeds such that edge sense lines operate at a higher rate. The foregoing example of utilizing an over-drive/kick voltage may be utilized during a read, verify and/or programming operation. In other examples, during a program operation, the dummy lines are biased identical to the edge sense line pattern.

In some implementations, an apparatus includes an array of memory cells, a sense line coupled to one or more cells of the array of memory cells, a dummy line arranged in a neighboring location to the sense line, and a charge device. The charge device is configured to charge the dummy line to a first voltage during a first portion of a period and to a second voltage during a second portion of the period, in which the second voltage is different than the first voltage, and the second portion contiguously follows the first portion. The charge device is also configured to charge the sense line to a third voltage during at least the second portion of the period.

As used herein, the term "shunt" may refer to a structure configured to deliver a supply voltage to a flash memory. In one or more examples, a shunt may deliver a supply voltage to a 3D NAND string terminal. In one or more examples, a shunt is a metal layer (or a portion thereof) electrically connected to a source line voltage. In one or more examples, a shunt may conduct current from the source line voltage to source terminals of a NAND string through a local interconnect. In one or more examples, a shunt is formed on a physical metal layer referred to as a M0 metal layer. In some implementations, the term "shunt" may generally be referred to as a "shunt region" or "shunt structure."

As used herein, the term "sense line" may refer to a structure (e.g., an annular structure) connected to a sensing output. In one or more aspects, a sense line may be configured to conduct current between a bit line and a source line. In one or more examples, a sense line may be formed of a channel layer material (e.g., undoped polysilicon). In one or more examples, a sense line may be a structure orthogonal to control gate lines (e.g., word lines). In one or more examples, a sense line may be arranged along a first axis, along a second axis orthogonal to the first axis, or along a third axis orthogonal to the first and second axes, depending on implementation without departing from the scope of the present disclosure. In some implementations, the term "sense line" may generally be referred to as a "sense line channel," "sense channel," "sense bit line channel," "sense line structure," "data bit line" or "regular data bit line."

As used herein, the term "dummy line" may refer to a structure (e.g., a longitudinal structure) that is not a sense line. In one or more aspects, a dummy line is not connected to any sensing output. In one or more aspects, a dummy line is not connected to memory cells. In some examples, a dummy line has no connection to memory cells or an array of memory cells in the 3D NAND architecture and, therefore, is not utilized to send or receive any data or control signals to or from memory cells. In one or more examples, a dummy line may be a structure parallel to a sense line (or data bit line) and orthogonal to control gate lines (e.g., word lines). In one or more examples, a dummy line may be arranged along a first axis, along a second axis orthogonal to the first axis, or along a third axis orthogonal to the first and second axes, depending on implementation without departing from the scope of the present disclosure. In one or more examples, a dummy line may be formed of a metallic material (e.g., metal). In one or more examples, a dummy line is formed on a physical metal layer referred to as a M1 metal layer. In one or more implementations, a dummy line may be part of a metal layer region that is above a shunt region. In one or more examples, the metal layer region above the shunt region is generally referred to as a dummy line region. In one or more examples, a dummy line region overlaps at least a portion of a shunt region and is electrically isolated from the shunt region. In one or more aspects, a dummy line may be configured to conduct current between two different lines and carry an independent voltage signal. In some examples, a dummy line carries a voltage signal independent of any voltage signal carried by the shunt region. In one or more aspects, a dummy line carries a different voltage than that of the shunt region. In one or more implementations, a dummy line may include a sense line that is converted into, or used, as a dummy line. In one example, such a dummy line may be, for example, connected to one or more memory cells that are not used for data storage. In some implementations, the term "dummy line" may generally be referred to as a "dummy bit line," "dummy channel," "dummy line channel," "dummy bit line channel," "dummy line structure," "dummy line region" or "dummy bit line region."

As used herein, the term "neighboring location" may refer to a location adjacent to a next neighboring structure such as a dummy line or a sense line. In one or more examples, a neighboring location includes a dummy line located immediately next to a sense line without any intermediate components such as other dummy lines or other sense lines interposed between the dummy line and the sense line. In one or more examples, a neighboring location may include a location that is spatially apart from a next neighboring structure such that the neighboring structures are not in physical contact but are immediately proximate to one another.

As used herein, the term "local interconnect" may refer to an interconnect structure within flash memories (e.g., a planar structure). In one or more examples, a local interconnect may be a structure connected to a source rail and to source terminals of a NAND string (or at least a portion of a 3D memory array). A local interconnect may be arranged within the 3D memory array and interposed between segments of 3D NAND strings. In one or more examples, a local interconnect may be arranged on a peripheral area of the 3D memory array. In one or more examples, a local interconnect is a metal layer (or a portion thereof) for conducting current from a shunt region to source terminals of the NAND strings. In one or more examples, a local interconnect may extend longitudinally along a first axis parallel to a longitudinal length of the NAND strings and also extend longitudinally along a second axis that is orthogonal to the first axis. In this respect, a local interconnect may represent a vertical metal layer (e.g., along a z-axis) that is interposed between segments of the 3D memory array and also arranged on peripheral edges of the 3D memory array.

As used herein, the term "selected memory cell" may refer to a memory cell that is selected for a sensing operation, such as a read operation or a program verify operation. In one or more implementations, the terms "cell voltage" and "memory cell voltage," in the context of flash memory cells, may refer to a threshold voltage of the memory cell, which is the minimum voltage that needs to be driven to the gate of the memory cell's transistor in order for the transistor to conduct current. Similarly, read voltages to flash memory cells are gate voltages applied to the gates of the flash memory cells to determine whether the memory cells conduct current at that gate voltage. In some implementations, when a flash memory cell's transistor conducts current at a given read voltage, indicating that the cell voltage is less than the read voltage, the raw data value for that read operation is a "1" and otherwise the raw data value is a "0."

In one or more implementations, the term "magnitude" may refer to an absolute value of a voltage potential. In one or more implementations, the term "rate of charging" may refer to a measure of a rate at which a memory cell is charged relative to a target voltage.

FIG. 1 illustrates an example data storage system 100 that may implement a system for asymmetric voltage ramp rate control in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The system 100 includes a data storage device 110 and a host device 130. The data storage device 110 includes one or more flash memory circuits 112A-N, one or more channels 113A-N, a controller 114, storage medium 122, an interface 124. The controller 114 may include one or more decoders (not shown), such as error-correcting code (ECC) decoders, one or more encoders (not shown), such as ECC encoders. The one or more decoders and/or the one or more encoders may be one or more dedicated circuits of the controller 114, may be implemented via firmware running on the controller 114, and/or may be one or more circuits separate from the controller 114. As used herein, the term "flash memory" may be used interchangeably with the terms "non-volatile memory circuit" and "flash memory circuit."

The processor of controller 114 may be a general-purpose microprocessor, a multi-core processor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions executed by controller 114 and/or its processor may be stored and read from the storage medium 122 or the one or more flash memory circuits 112A-N, electronic media, optical media, magnetic media, or other type(s) of storage media. These storage media represent examples of tangible and/or non-transitory machine or computer readable media on which instructions/code executable by controller 114 and/or its processor may be stored. In some implementations, the instructions may be received from the host device 130 (for example, via the interface 124).

The storage medium 122 may comprise random access memory (RAM), static random-access memory (SRAM), dynamic random-access memory (DRAM), synchronous dynamic random-access memory (SDRAM), such as DDR3, or any combination thereof. In some aspects, the storage medium 122 is used to temporarily store data and information used to manage data storage system 100. The storage medium 122 may be implemented using a single RAM module or multiple RAM modules. While the storage medium 122 is depicted as being distinct from the controller 114, those skilled in the art would recognize that storage medium 502 may be incorporated into the controller 114 without departing from the scope of the subject technology. Alternatively, the storage medium 122 may be a non-volatile memory such as a magnetic disk, flash memory, peripheral SSD, and the like.

The one or more flash memory circuits 112A-N may include, according to various aspects, one or more flash integrated circuits, Chalcogenide RAM (C-RAM), Phase Change Memory (PCM or PC-RAM), Programmable Metallization Cell RAM (PMCRAM or PMCm), Ovonic Unified Memory (OUM), Resistance RAM (ReRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRRAM), resistive cell design, other discrete NVM (non-volatile memory) chips, or any combination thereof. The data storage device 110 may further include other types of nonvolatile and/or volatile storage, such as magnetic storage.

The interface 124 of the data storage device 110 couples the data storage device 110 to the host device 130. The interface 124 may be a wired interface, such as a Peripheral Component Interface Controller (PCIC) interface, a Personal Computer Memory Card International Association (PCMCIA) interface, a Serial AT Attachment (SATA) interface, a universal serial bus (USB) interface, or generally any wired interface. Alternatively, or in addition, the interface 124 may be a wireless interface, such as wireless SATA, Bluetooth, or generally any wireless interface. The interface 124 may be configured to implement only one interface. Alternatively, the interface 124 (and/or the I/O interface of the controller 114) may be configured to implement multiple interfaces, which may be individually selectable using a configuration parameter selected by a user or programmed at the time of assembly. The interface 124 may include one or more buffers for buffering transmissions between the host device 130 and the controller 114.

The channels 113A-N may each communicatively couple one or more of the flash memory circuits 112A-N to the controller 114. In one or more implementations, the channels 113A-N may be directly coupled to the controller 114, e.g. The channels 113A-N may be wired interfaces.

The host device 130 represents any device configured to be coupled to the data storage system 100 and to store data in the data storage system 100. The host device 130 may be a computing system such as a personal computer, a server, a workstation, a laptop computer, PDA, smart phone, and the like. Alternatively, the host device 130 may be an electronic device such as a digital camera, a digital audio player, a digital video recorder, and the like.

In the system 100, the channel 113A is communicatively coupled to the flash memory circuit 112A, the channel 113B is communicatively coupled to the flash memory circuit 112B, the channel 113C is communicatively coupled to the flash memory circuit 112C, and the channel 113N is communicatively coupled to the flash memory circuit 112N. Although the channels 113A-N are illustrated in the system 100 as each being communicatively coupled to one of the flash memory circuits 112A-N, each of the channels 113A-N may be communicatively coupled to multiple of the flash memory circuits 112A-N as is discussed further below with respect to FIG. 1. When multiple of the flash memory circuits 112A-N are coupled to a single one of the channels 113A-N, only one of the flash memory circuits 112A-N may be able to transmit or receive data over the channel at any given time.

Each of the channels 113A-N may be implemented using one or more physical I/O buses coupled between one of the flash memory interfaces and the corresponding flash memory circuit(s). Each channel allows the corresponding flash memory interface to send read, write and/or erase commands to the corresponding flash memory device. Each flash memory interface may include a register (e.g., First-In-First-Out (FIFO) register) that queues read, write and/or erase commands from the controller 114 for the corresponding flash memory device. Although the term "channel," as used above in reference to FIG. 1, may refer to the bus coupled between a flash memory interface and the corresponding flash memory device, the term "channel" may also refer to the corresponding flash memory device that is addressable.

The channels 113A-N may each be associated with a maximum bandwidth and/or throughput. Similarly, the interface 124 may also be associated with a maximum bandwidth and/or throughput. Thus, there may be bandwidth/throughput limitations on the amount of data that can be transferred and/or over each of the channels 113A-N at any given time. Furthermore, each of the flash memory circuits 112A-N may be capable of processing only a single command, e.g. a write command or a read command, at any given time.

The controller 114 may be operable to read data from, and write data to, the flash memory circuits 112A-N via the channels 113A-N. For example, the controller 114 receives data, such as a stream of data, from the host device 130 via the interface 124, where the data may be then written to one or more of the flash memory circuits 112A-N via one or more of the channels 113A-N.

The controller 114 may utilize the storage medium 122 to queue system data and/or host data that are intended to be stored in the flash memory circuits 112A-N. For example, the storage medium 122 may be used as a buffer for rate control, or may otherwise be used to store information (e.g., queues, variables, physical block status, logical to physical address mapping tables, endurance/retention data, settings, etc.) utilized by the controller 114 to read/write data to/from the flash memory circuits 112A-N. Since the storage medium 122 may be volatile memory, the controller 114 may write from the storage medium 122 to the flash memory circuits 112A-N to permanently store information in one or more of the flash memory circuits 112A-N. When the data storage device 110 is powered on, the controller 114 may retrieve the information from the one or more flash memory circuits 112A-N and store the information in the storage medium 122. The storage medium 122 may be part of the controller 114 in some implementations, or the storage medium 122 may be a separate component and communicably coupled to the controller 114 in other implementations.

Storage access commands communicated by the interface 124 may include read and write commands issued by the host device 130. Read and write commands may specify a logical address (e.g., logical block addresses or LBAs) used to access the data storage device 110.

The flash memory circuits 112A-N may each include physical blocks, such as NAND blocks and/or NOR blocks. The physical blocks may each include physical pages to which data may be written to or read from. Although the physical pages of the blocks of the flash memory circuits 112A-N can be individually written to (e.g., a physical page being a unit for read/write operations), the physical pages of a block of the flash memory circuits 112A-N cannot be individually erased. Instead, a page of a block can only be erased, and subsequently rewritten to, by erasing all of the pages of the block (e.g., a block being a unit for erase operations). Thus, as data is moved from a page of a block, or the data is deleted, the page may be marked invalid and cannot be reused until the entire block is erased. The flash memory circuits 112A-N may not be limited to any particular capacity or configuration. For example, the number of physical blocks, the number of physical pages per physical block, the number of sectors per physical page, and the size of the sectors may vary within the scope of the subject technology.

It should be understood that in all cases data may not always be the result of a command received from the host device 130 and/or returned to the host device 130. In some aspects, the controller 114 may be configured to execute a read operation independent of the host device 130 (e.g., to verify read levels or BER).

Figure 2:
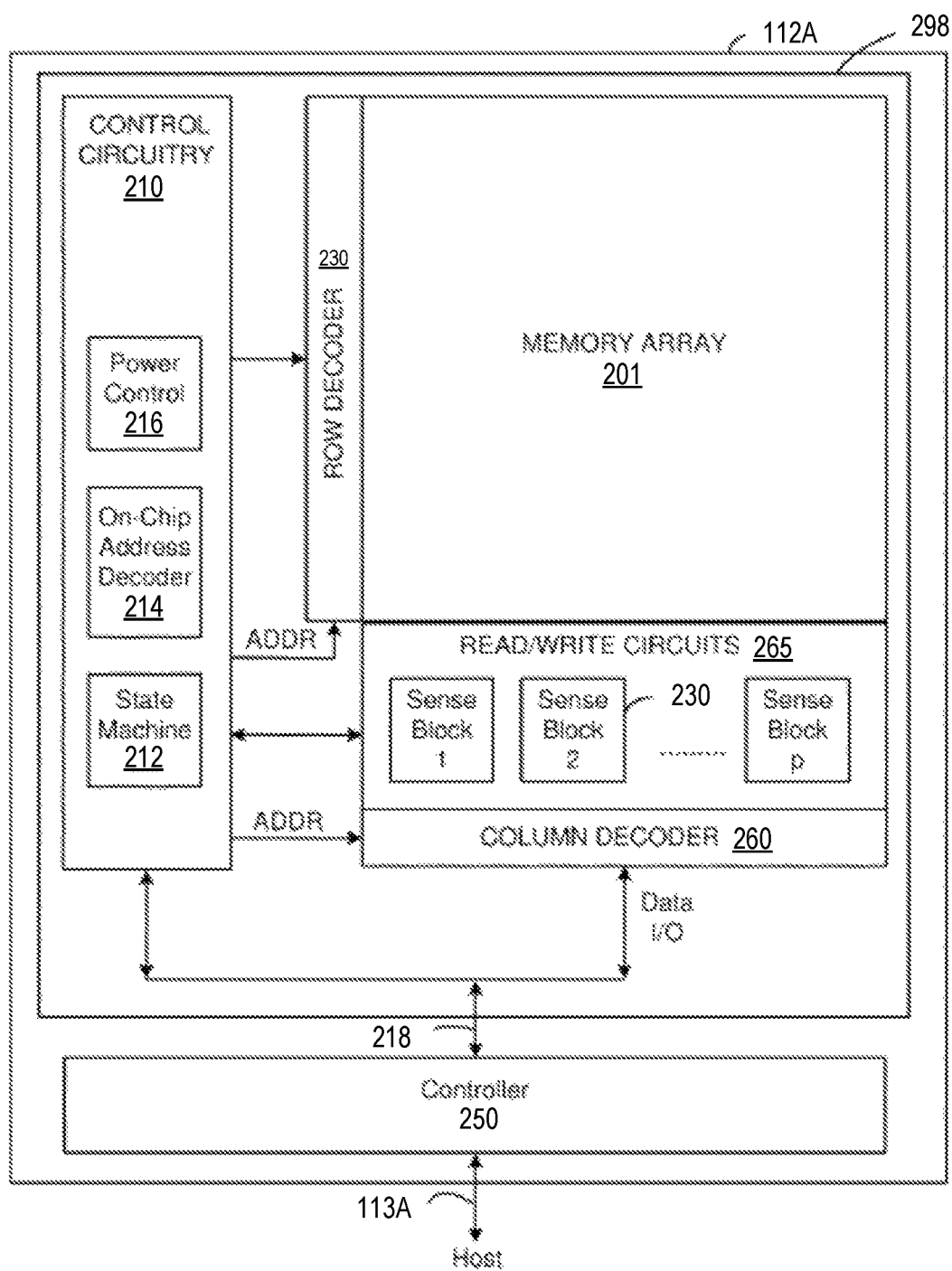
FIG. 2 illustrates an example of a non-volatile storage system including control circuitry for sensing of memory cells in accordance with one or more implementations.

FIG. 2 depicts one implementation of a flash memory circuit (e.g., 112A) including read/write circuits for reading and programming a page (or other unit) of memory cells (e.g., NAND multi-level cells) in parallel. As depicted, the flash memory circuit 112A includes a memory die 298 and a controller 250. The memory die 298 includes a memory array 201 (e.g., a NAND flash memory array), a control circuitry 210, a row decoder 230, a column decoder 260, and read/write circuits 265. In one implementation, access to the memory array 201 by the various peripheral circuits (e.g., row decoders or column decoders) is implemented in a symmetric fashion, on opposite sides of the array, so that the densities of access lines and circuitry on each side are reduced by half. The memory array 201 is addressable by word lines via a row decoder 230 and by bit lines via a column decoder 260. Word lines and bit lines are examples of memory array control lines. The read/write circuits 265 include multiple sense blocks 200 that allow a page of storage elements to be read or programmed in parallel. In some cases, the controller 250 may be integrated on the memory die 298. Commands and data are transferred between the host and controller 250 via the channel 113A and between the controller 250 and the memory die 298 via lines 218.

The control circuitry 210 cooperates with the read/write circuits 265 to perform memory operations on the memory array 201. The control circuitry 210 includes a state machine 212, an on-chip address decoder 214, and a power control module 216. The state machine 212 provides chip-level control of memory operations. The on-chip address decoder 214 provides an address interface between the addresses used by the host and the hardware addresses used by the decoders 230 and 260. The power control module 216 controls the power and voltages supplied to the word lines and bit lines during memory operations. In one implementation, a power control module 216 includes one or more charge pumps that may generate voltages greater than the supply voltage.

In some implementations, one or more of the components (alone or in combination), other than memory array 201, may be referred to as a managing or control circuit. For example, one or more managing or control circuits may include any one of or a combination of control circuitry 210, state machine 212, decoders 230/360, power control 216, sense blocks 200, read/write circuits 265, controller 250, and so forth. The one or more managing circuits or the one or more control circuits may perform or facilitate one or more memory array operations including erasing, programming, or reading operations.

In some implementations, one or more managing or control circuits may be used for controlling the operation of a memory array, such as the memory array 201. The one or more managing or control circuits may provide control signals to the memory array in order to perform a read operation and/or a write operation on the memory array. In some aspects, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In some aspects, the one or more control circuits may comprise an on-chip memory controller for determining row and column addresses, word line and bit line addresses, memory array enable signals, and/or data latching signals.

In one implementation, the memory array 201 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one implementation, a page may be the unit of programming. Other units of programming can also be used. One or more pages of data are typically stored in one row of memory cells. For example, one or more pages of data may be stored in memory cells connected to a common word line. In one implementation, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 22, 64, 128 or more pages. Different sized blocks, pages, and sectors can also be used.

Figure 3:
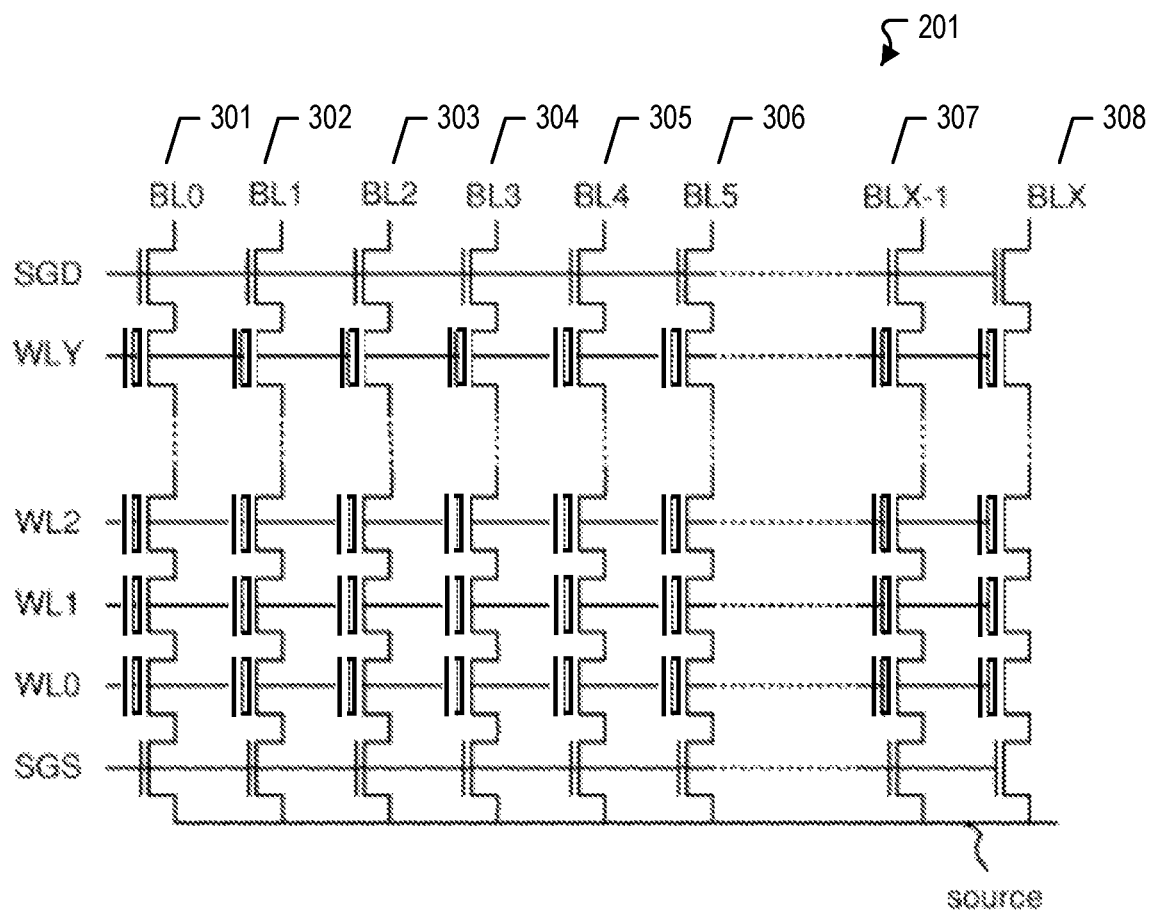
FIG. 3 illustrates an example of a memory block including a multiple not-and (NAND) strings in accordance with one or more implementations.

FIG. 3 depicts one implementation of a memory block (e.g., the memory array 301) including multiple NAND strings. As depicted, each NAND string includes (Y+1) memory cells. Each NAND string is connected to one bit line out of (X+1) bit lines on the drain side (e.g., one bit line of bit lines BL0-BLX) via a drain-side select gate controlled by the drain-side selection signal SGD. For example, as shown in FIG. 3, the memory array 301 includes bit lines 301 (BL0), 302 (BL1), 303 (BL2), 304 (BL3), 305 (BL4), 306 (BL5), 307 (BLX−1) and 308 (BLX). Multiple memory cells are connected through a drain select gate SGD to an associated bit line BL at the top and connected through an associated source select gate SGS to the associated local source line LI to a global source line SL (e.g., CELSRC). Each NAND string is connected to a source line (source) via a source-side select gate controlled by source-side selection signal SGS. In one implementation, the source-side select gate controlled by source-side selection signal SGS and the drain-side select gate controlled by the drain-side selection signal SGD may comprise transistors that include a charge trap dielectric or transistors that include a floating gate structure.

In one implementation, during a programming operation, when programming a memory cell, such as a NAND flash memory cell, a program voltage may be applied to the control gate of the memory cell and the corresponding bit line may be grounded. These programming bias conditions may cause electrons to be injected into the charge storage region (e.g., charge trap dielectric) via field-assisted electron tunneling, thereby raising the threshold voltage of the memory cell. The program voltage applied to the control gate during a program operation may be applied as a series of pulses. In some aspects, the magnitude of the programming pulses may be increased with each successive pulse by a predetermined step size. Between programming pulses, one or more verify operations may be performed.

In one implementation, memory cells may be erased by raising the p-well to an erase voltage for a sufficient period of time and grounding the word lines of a selected block of memory cells while the source and bit lines are floating. These erase bias conditions may cause electrons to be transferred from the charge trap dielectric through the tunneling oxide, thereby lowering the threshold voltage of the memory cells within the selected block. In some aspects, an erase operation may be performed on an entire memory plane, on individual blocks within a memory plane, or another unit of memory cells.

In some implementations, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. In some cases, during a verify operation, the source line may be set to 0V, to 1V, or to any voltage greater than or less than ground. In one example, during a verify operation, the source line may be set to 1V and the selected word line may be set to 5V. In another example, during a verify operation, the source line may be set to 3V and the selected word line may be set to 2V.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 4A:
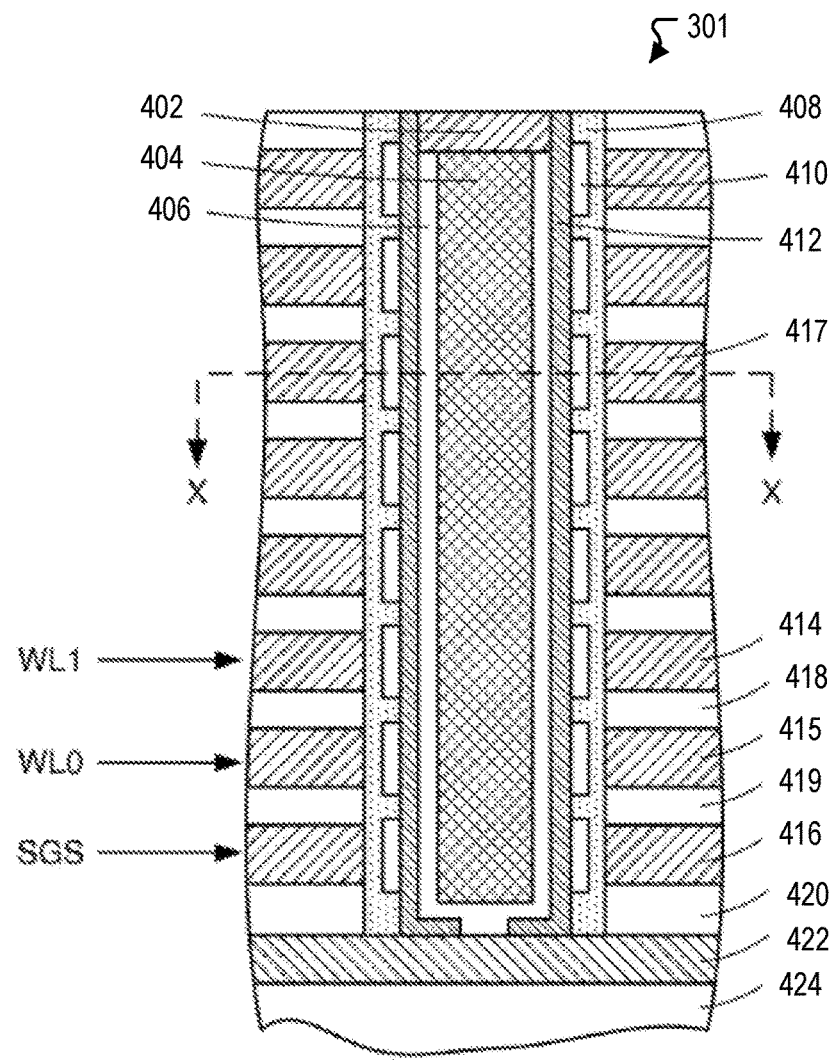
FIG. 4A illustrates an example of a vertical NAND structure in accordance with one or more implementations.

FIG. 4A depicts an implementation of a vertical NAND structure. The vertical NAND structure includes an inverted NAND string formed above a substrate 424 and oriented such that the inverted NAND string is orthogonal to the substrate 424. An inverted NAND string may include a NAND string that includes an inverted charge trap transistor with a tunneling oxide between a charge trap dielectric of the inverted charge trap transistor and a control gate of the inverted charge trap transistor. The arrangement of the tunneling oxide between the charge trap dielectric and the control gate allows the mechanism (e.g., F-N tunneling as the transport mechanism) for programming and/or erase of the inverted charge trap transistor to occur between the charge trap dielectric and the control gate rather than between the charge trap dielectric and the channel of the inverted charge trap transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above the substrate 424 (e.g., a silicon substrate). In some aspects, a first word line (WL1) may correspond with the control gate layer 414, a second word line (WL0) may correspond with the control gate layer 415, and a source-side select gate line (SGS) may correspond with the control gate layer 416.

In some implementations, within the memory hole a tunneling layer material 408 (e.g., including a thin oxide), a charge trap material 410 (e.g., silicon nitride or silicon oxynitride), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may include a portion of a multi-layer dielectric stack such as an ONO dielectric stack, which includes alternating layers of silicon dioxide ("O") and silicon nitride ("N"). In some aspects, the tunneling layer material 408 may include a high-K dielectric material (e.g., hafnium-based high-K dielectrics or hafnium oxide) that has a dielectric constant that is greater than that of silicon dioxide. In some aspects, a core material layer 404 (e.g., oxide) may be formed within the memory hole. In other aspects, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this aspect, the bit line contact layer 402 connects to the inverted NAND string at the top of the memory hole and the source line contact layer 422 connects to the inverted NAND string at the bottom of the memory hole. In one or more implementations, a sense line channel may be formed of a channel layer material 406. In some implementations, the memory hole includes a floating gate material (e.g., polysilicon) in lieu of the charge trap material 410.

In some implementations, the bit line contact layer 402 may include a material of a first conductivity type (e.g., n-type) and the source line contact layer 422 may include a material of a second conductivity type different from the first conductivity type (e.g., p-type). In an aspect, the bit line contact layer 402 may include an n-type material (e.g., n-type polysilicon) and the source line contact layer 422 may include a p-type material (e.g., p-type polysilicon). In another aspect, the bit line contact layer 402 may include a p-type material and the source line contact layer 422 may include an n-type material (e.g., n-type polysilicon). Thus, in some aspects, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may include n-channel operations and/or p-channel operations depending on the bias conditions applied to the inverted NAND string.

In some implementations, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a charge trap layer that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
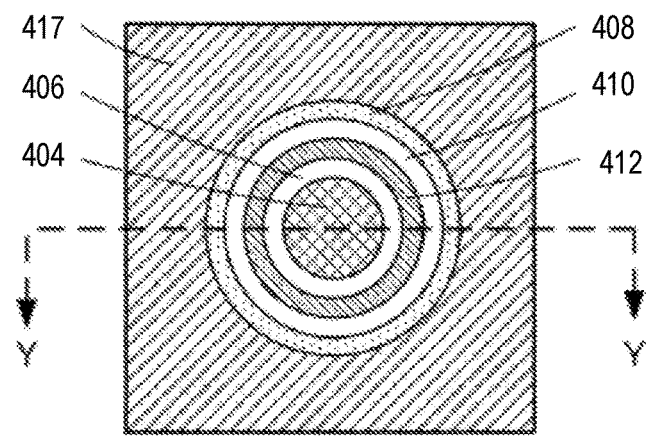
FIG. 4B illustrates a cross-sectional view of the vertical NAND structure along line X-X of FIG. 4A in accordance with one or more implementations.

FIG. 4B depicts an implementation of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the charge trap material 410 that is surrounded by the tunneling layer material 408 that is surrounded by the control gate material layer 417. In one implementation, FIG. 4A may depict a cross-sectional view taken along line Y-Y of FIG. 4B. In one implementation, the inverted NAND string may be formed using a vertical cylindrical structure or a vertical tapered cylindrical structure. In this case, the dielectric material 412, charge trap material 410, tunneling layer material 408, and channel layer material 406 of the inverted NAND string may comprise vertical annular structures surrounding the core material layer 404. In another implementation, the inverted NAND string may be formed using a vertical pillar structure or a vertical rectangular prism structure.

In some implementations, a vertical NAND structure may include a vertical NAND string formed above a substrate (e.g., 424) and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5A:
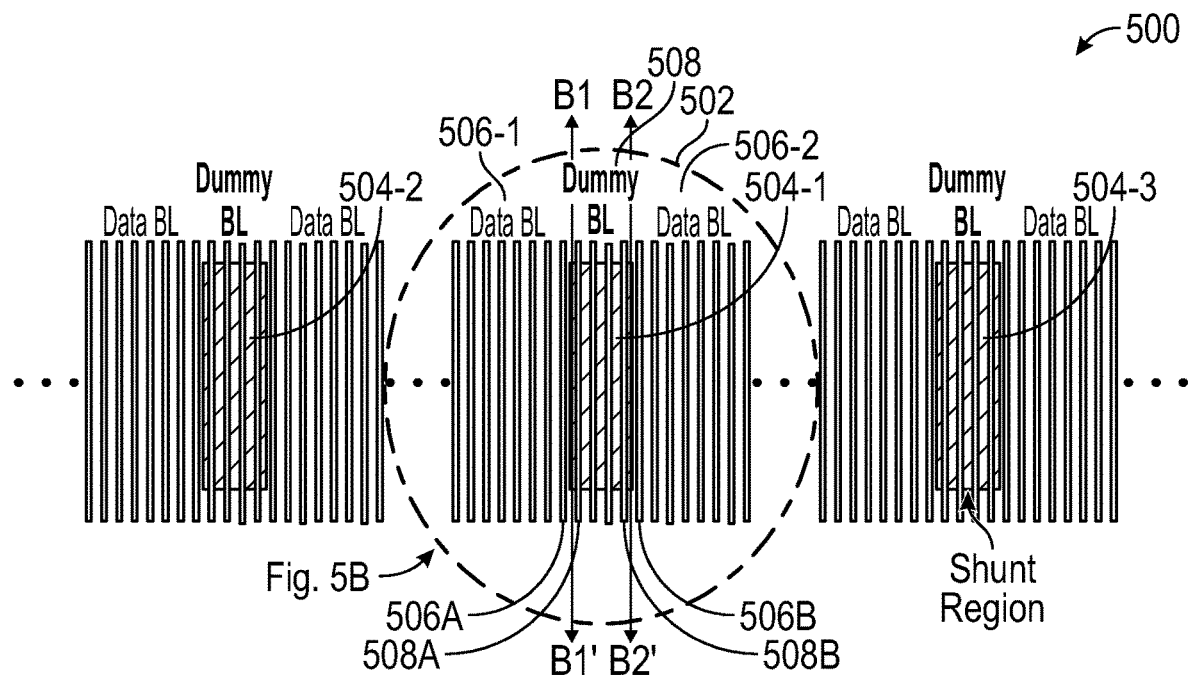
FIG. 5A conceptually illustrates a top view of exemplary bit line structures of a three-dimensional (3D) memory array in accordance with one or more implementations of the subject technology.

FIG. 5A conceptually illustrates a top view of exemplary bit line structures 500 of a 3D memory array in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In 3D NAND architecture, there is a periodic region referred to as a "shunt region" (e.g., 504), which is used to deliver a source line voltage (e.g., CELSRC) to each individual block of memory (or memory cells). The shunt region 504 can include routing in parallel with regular data bit lines (e.g., 506-1, 506-2) and is a structure that repeats at a regular interval (e.g., every 3072 regular data bit lines, or every 1536 regular data bit lines). This regular interval can be any arbitrary value depending on implementation. Due to process requirements, such as keeping lithography periodicity, the dummy bit lines (e.g., 508), which have no connection to memory cells storing data, are needed over the shunt regions (e.g., 504-1, 504-2, 504-3).

Figure 5B:
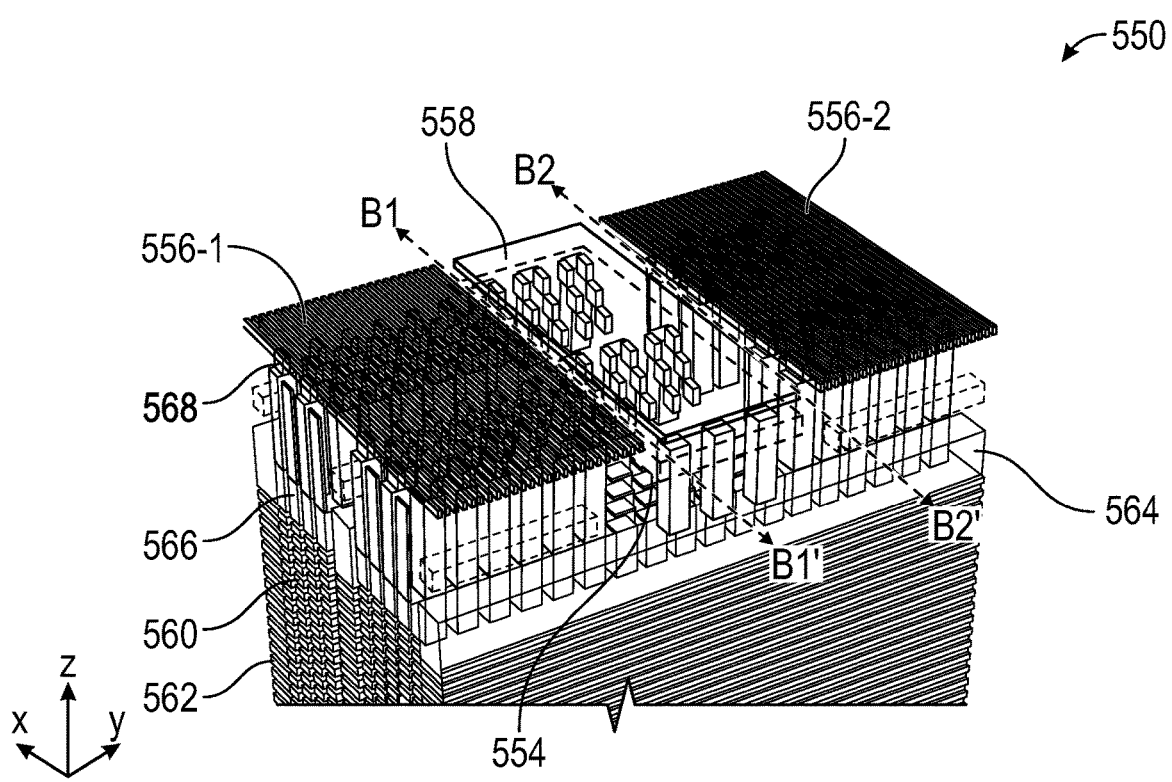
FIG. 5B illustrates a particular monolithic 3D memory array in accordance with one or more implementations of the subject technology.

FIG. 5B illustrates a particular monolithic 3D memory array 550 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

As depicted in FIG. 5B, the particular 3D memory array is of a NAND type (more specifically of the "BiCS" type), where one or more memory device levels are formed above a single substrate. FIG. 5B is an oblique projection of part of such a structure, showing a portion corresponding to the top-view bit line structure 502 in FIG. 5A along the B1-B1' and B2-B2' axes. Here, instead of the NAND strings lying in a common y-z plane, they are laterally arranged contiguously in the y direction, so that the NAND strings are staggered in the x direction. In one or more examples, a NAND string (e.g., any of 301-308 of FIG. 3) may refer to a series of NAND cells (see, e.g., 560 in FIG. 5B) connected by a vertical channel (e.g., a vertical channel formed of the channel layer material 406 in FIG. 4A) from a source line (e.g., a source line formed of the source line contact layer 422 in FIG. 4A) to a bit line (e.g., a bit line formed of the bit line contact layer 402 in FIG. 4A, or any of bit lines 556-1 and 556-2 in FIG. 5B). In one example, the NAND strings are connected along global bit lines 556-1 and 556-2 (or referred to as regular data bit lines) spanning multiple sub-divisions of the array that run in the x direction. Here, global common source lines (not shown) also run across multiple such structures in the x direction and are connected to the sources at the bottoms of the NAND strings, which are connected by a local interconnect 564 that serves as the local common source line of an individual NAND string. Depending on the implementation, the global source lines can span the whole, or just a portion, of the array structure. Rather than using the local interconnect 564, variations can include the NAND string being formed in a U type structure, where part of the string itself runs back up.

In 3D NAND architecture, a "shunt" is a region (e.g., 554) of a first metal layer (referred to as M0 metal layer) that delivers a source line voltage (e.g., CELSRC) to the source terminal of a NAND string (e.g., source of FIG. 3). For example, the shunt connects to local interconnects, which then carry voltage signals to a source side of a NAND string (at a bottom of the 3D NAND memory). Above the shunt region 554, there is a second metal layer (referred to as M1 metal layer). In some aspects, the M1 metal layer disposed above the shunt region 554 is of a same type of material as the regular data bit line metal layers (e.g., 556-1, 556-2). Due to lithography periodicity requirements, similar bit line structures (e.g., 558) are needed on top of the shunt region 554, namely dummy bit lines (e.g., 558).

The dummy bit lines 558, which have no data access, are placed over the shunt regions (e.g., 554). In comparison to the regular data bit lines 556-1 and 556-2, the dummy bit lines 558 have no connection to any memory cells of the array of memory cells (e.g., 560), so the dummy bit lines 558 are not utilized to interact with any data. For example, the dummy bit lines 558 and memory cells 560 are physically separated by the shunt region (e.g., 554), and therefore, there is no route of the dummy bit line 558 signals to the underneath memory cells 560.

The M0 metal layer and M1 metal layer represent physical metal layers of the 3D NAND architecture. Each of the M0 and M1 metal layers can carry any independent voltage signal. Specifically, for the dummy bit line region (e.g., 558) on top of the shunt region 554, the M1 metal layer is electrically isolated from the M0 metal layer. For example, the 3D memory array 550 includes one or more isolation layers (not shown) interposed between the M0 and M1 metal layers. In some aspects, the isolation layer is composed of an oxide material. In this respect, the dummy bit lines 558 and the M0 metal layer are isolated, so the dummy bit line region (e.g., 558) and shunt region 554 can carry different voltages.

The shunt region 554 is connected to the local interconnect 564. In some aspects, the shunt region 554 is connected to the local interconnect 564 on both sides of a group of NAND strings. The source line voltage (e.g. 0V) is supplied by the shunt region 554 on the M0 metal layer and through the local interconnect 564. In this regard, the source line voltage is not supplied by the dummy bit line region (e.g., 558) on the M1 metal layer.

In some aspects, the regular data bit lines 556-1 and 556-2 are coupled to the memory cells 560 underneath through annular structures 550 that serve as contacts. In other aspects, the regular data bit lines 556-1 and 556-2 may be coupled to annular structures 550 through via structures 568. In some examples, the via structures 568 represent through-silicon-vias (or TSVs).

As depicted in FIG. 5A, the dummy bit lines 508 include four dummy bit lines, where two edge dummy bit lines immediately neighbor corresponding edge data bit lines. For example, an edge dummy bit line 508A and an edge data bit line 506A (along the B1-B1' axis) are neighboring lines. An edge dummy bit line 508B and an edge data bit line 506B (along the B2-B2' axis) are neighboring lines. In some implementations, the dummy bit lines 508 may include an arbitrary number of bit lines depending on implementation. In some examples, the dummy bit lines 508 consists of one dummy bit line. In other examples, the dummy bit lines 508 include at least two dummy bit lines.

As used herein, when a region contains a group of dummy bit lines (e.g., 508 in FIG. 5A), an edge dummy bit line may refer to a dummy bit line located at an edge of the group of dummy bit lines (e.g., the first or the last one of the group of dummy bit lines, such as 508A or 508B). As used herein, when a region contains a group of data bit lines (e.g., 506-1 or 506-2), an edge data bit line may refer to a data bit line located at an edge of the group of data bit lines (e.g., the first or the last one of the group of data bit lines, such as 506A or 506B). A group of dummy bit lines may refer to a plurality of dummy bit lines. A group of data bit lines may refer to a plurality of data bit lines.

Figure 6:
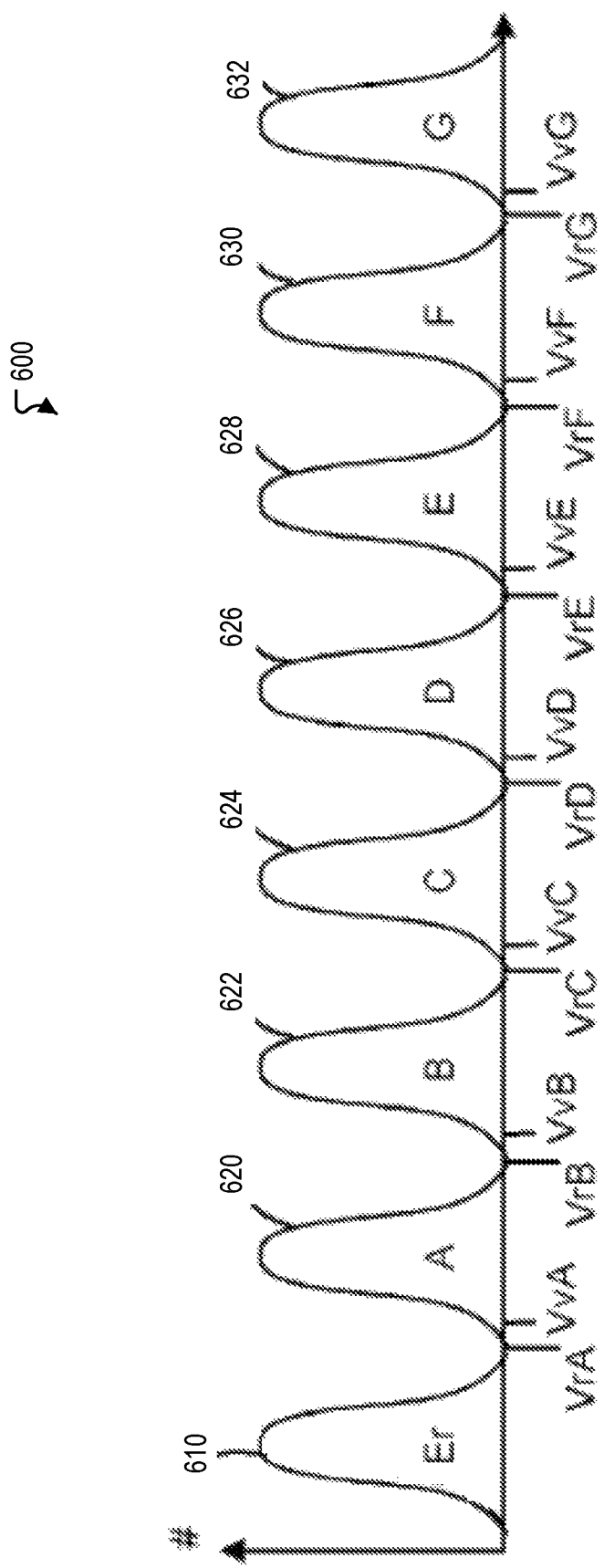
FIG. 6 illustrates an example of a threshold voltage distribution found in a multi-level flash memory cell over time in accordance with one or more implementations.

FIG. 6 illustrates an example of voltage distributions 600 found in multi-level flash memory cells over time in accordance with one or more implementations. The voltage distributions 600 shown in FIG. 6 have been simplified for illustrative purposes. The cell voltage of a MLC approximately extends from a voltage, VSS, at the source terminal of a NMOS transistor to a voltage, VDD, at the drain terminal. As such, the voltage distributions 600 can extend between VSS and VDD.

The set of memory cells associated with the voltage distributions 600 are connected to a word line, after a programming operation, where eight data states are used. A Vth distribution 610 is provided for erased (Er) state memory cells. Vth distributions 620, 622, 624, 626, 628, 630 and 632 represent assigned data states A, B, C, D, E, F and G, respectively, which are reached by memory cells when their threshold voltage (Vth) exceeds program verify voltages VvA, VvB, VvC, VvD, VvE, VvF or VvG, respectively. Read voltages VrA, VrB, VrC, VrD, VrE, VrF and VrG are used to read data from a set of cells having this Vth distribution.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

The read voltages VrA, VrB, VrC, VrD, VrE, VrF and VrG are positioned between adjacent center voltages (e.g., positioned at or near the halfway point between adjacent center voltages) and, thus, define threshold voltages between the voltage ranges 610, 620, 622, 624, 626, 628, 630 and 632. During a read operation, one of the read voltages VrA, VrB, VrC, VrD, VrE, VrF and VrG is applied to determine the cell voltage using a comparison process. However, due to the various factors, the actual cell voltage, and/or the cell voltage received when reading the MLC, may be different from a respective center voltage corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read voltages, making it difficult to determine with certainty which of two adjacent bit-tuples is stored by the MLC.

Figure 7A:
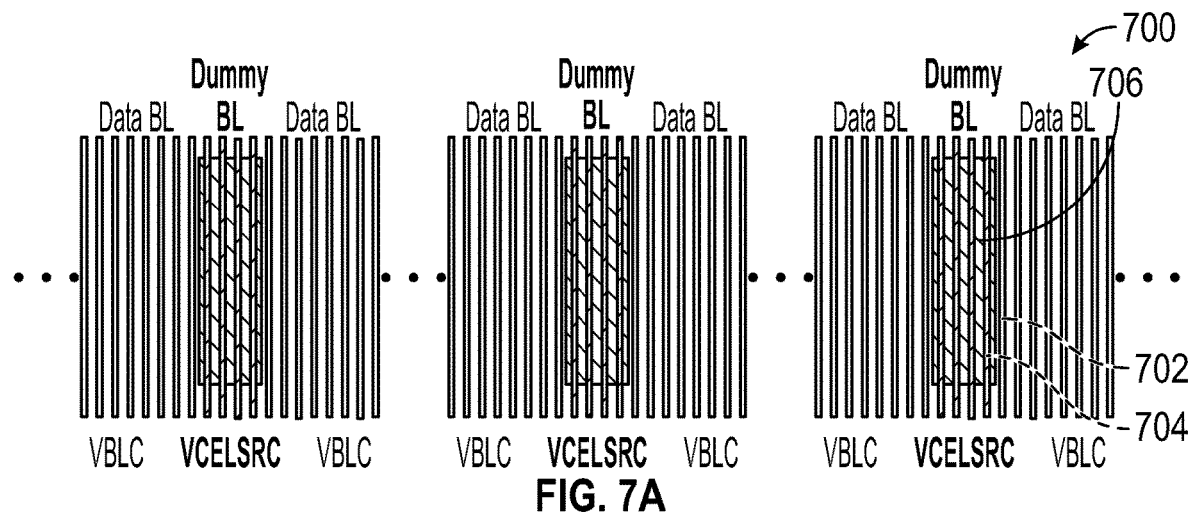
Figure 7B:
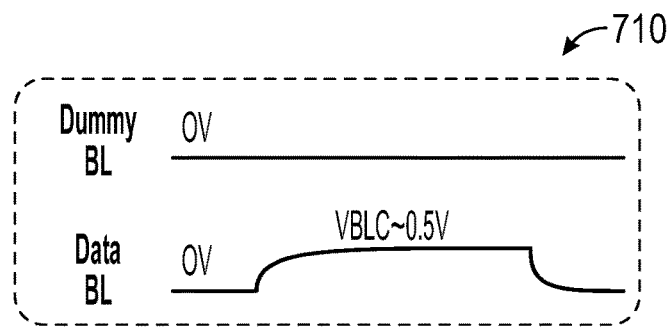

FIGS. 7A-7E illustrate examples of biasing levels that produce capacitive coupling on data bit lines. FIG. 7A illustrates a top view of bit line structures 700, which correspond to those described in FIG. 5A. As discussed above, due to lithography periodicity requirements, bit line structures similar to the data bit lines (e.g., 702) are needed on top of the shunt region (e.g., 706), namely dummy bit lines (e.g., 704). In comparison to the regular data bit lines 702, the dummy bit lines 704 have no connection to any memory cells of the array of memory cells (e.g., 560 of FIG. 5B) and, therefore, the dummy bit lines 704 do not have access to data and are not utilized to store any data.

In one or more implementations, the manner in how to bias these dummy bit lines becomes critical. The dummy bit lines 704 are found to be one of the read performance limiters. As illustrated in a voltage waveform 710 of FIG. 7B, the dummy bit lines (e.g., 726, 728) above the shunt region 706 are biased at the source line voltage (e.g., VCELSRC, which can be 0V), while the data bit lines are biased at a bit line voltage (e.g., VBLC, which can be 0.5V). In other approaches, the dummy bit lines 726, 728 are biased at a floating level. In either case, these biasing levels create a large capacitance loading at neighboring data bit lines 722, 724 next to the dummy bit lines 726, 728 as depicted in FIG. 7C.

As illustrated in FIGS. 7D and 7E, the difference in bias levels applied to the dummy bit lines 726, 728 and the data bit lines 722, 724 creates a strong dummy-bit-line-to-regular-data-bit-line capacitive coupling, which slows down the edge data bit line rate of charging during a read/verify operation or a programming operation. In FIG. 7D, a plot of minimum required timing distributions 730 for a particular data state (which corresponds to one of the distributions of FIG. 6) illustrate the edge data bit line 722 that corresponds to Tier 15, 10-7 is failing in read performance sooner than other data bit lines of a same bank that do not neighbor (or immediately neighbor) the dummy line 726. Similarly, in FIG. 7E, a plot of minimum required timing distributions 740 for the same particular data state (which corresponds to one of the distributions of FIG. 6) illustrate the edge data bit line 724 that corresponds to Tier 0, IO-0 (on an opposing side of the shunt region 706 from the data bit line 722) is also failing in read performance sooner than other data bit lines of a same bank that do not neighbor (or immediately neighbor) the dummy line 728. These bits (e.g., data carried on data bit lines 722, 724) become the bottleneck of read performance, especially read operations clocked by the R-clock, namely the read clock. In short, these edge data bit lines (e.g., 722, 724) are among the first to fail during read/verify operations and programming operations. In FIGS. 7D and 7E, the x-axis is the minimum required timing (in microseconds), and the y-axis is the bit count.

Figure 8A:
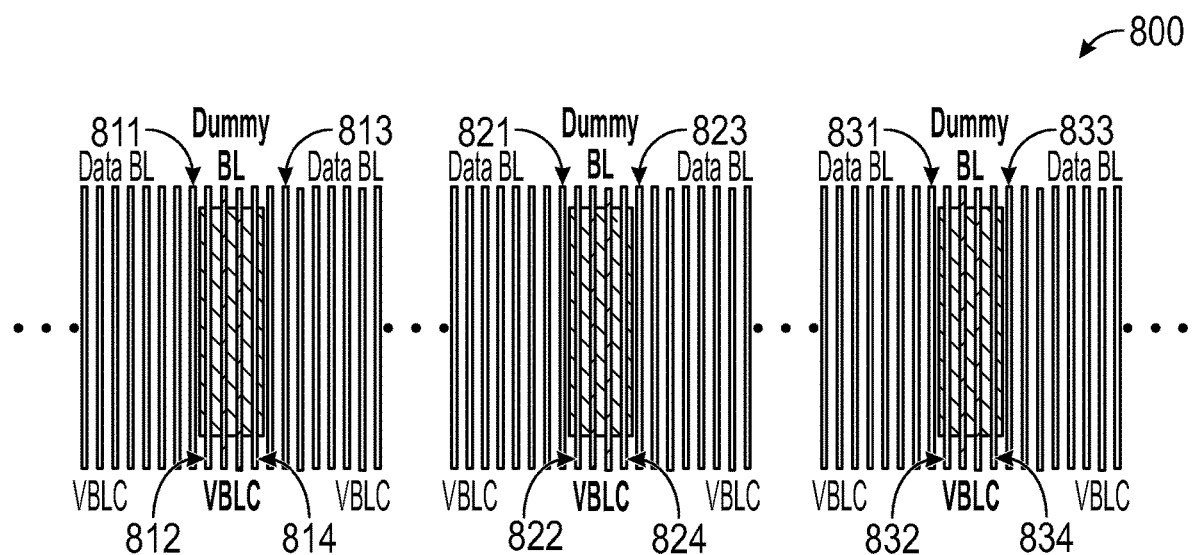
FIGS. 8A and 8B illustrate a first bias scheme of dummy bit lines over shunt.
Figure 8B:
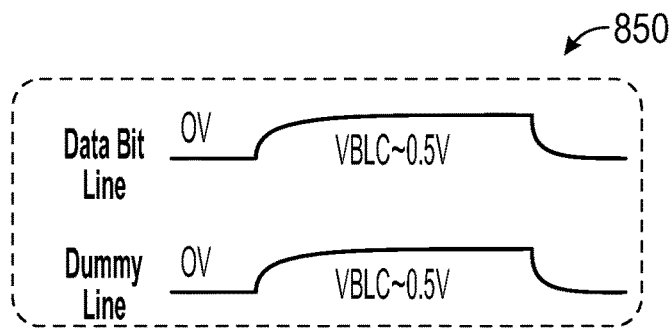

In order to reduce the unnecessary capacitive coupling, the subject technology provides for biasing the dummy bit lines to the same voltage as the regular data bit lines during a read operation and verify operation (see FIGS. 8A and 8B). In another embodiment, the subject technology provides for overdriving the dummy bit lines to a level that is higher than the voltage of the regular data bit lines, and then biasing the dummy bit lines to a final target level that is the same voltage as the regular data bit lines (see FIGS. 9A and 9B). During the over-kick, the charging rate of the edge data bit lines is accelerated. As a result, the bit line timing margin improves by about 2 μs. The subject technology also provides for increasing the programming speed of the edge data bit lines (e.g., bit line settling time) by biasing the dummy bit line the same as its neighboring edge data bit line during programming (see FIG. 10). For example, if the edge data bit line is in a first state (or logical '1' state), then the dummy bit line can be biased to a rail voltage, such as VDDSA (e.g., 3V). In another example, if the edge data bit line is in a second state (or logical '0' state), then the dummy bit line can be biased to ground (e.g., 0V).

FIG. 8A illustrates a top view of bit line structures 800 with a first bias scheme of dummy bit lines over shunt, which correspond to those described in FIG. 5A. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

By utilizing BiCS memory, or generally referred to as 3D NAND memory, if two neighbor bit lines (e.g., one regular data bit line and one dummy bit line) are fully at ground potential (e.g., VCELSRC), then the timing margin in the bit line timing can be reduced by about 5 μs. Therefore, if one neighboring dummy bit line is grounded, then the timing margin can be reduced by about 2.5 μs (or half of the 2-neighbor bit line timing scenario). The subject technology provides for a bias scheme for dummy bit lines over shunt. For example, during a read and verify operation, dummy bit lines can be biased at a same voltage as regular data bit lines (e.g., VBLC). This bias scheme can accelerate read speeds such that edge data bit lines operate at a higher rate.

As illustrated in a voltage waveform 850 of FIG. 8B, the dummy bit lines (e.g., 812, 814, 822, 824, 832, 834) above respective shunt regions and the data bit lines (e.g., 811, 813, 821, 823, 831, 833) are biased at the bit line voltage (e.g., VBLC~0.5V). In some examples, control circuitry (e.g., 210) charge the dummy lines and data bit lines at a same rate of charging to a same target voltage. In this respect, the rate of charging of the data bit lines compared to the dummy lines is substantially identical. In other implementations, the dummy bit lines and the data bit lines can both be biased at the source line voltage (e.g., VCELSRC~0V).

Figure 9A:
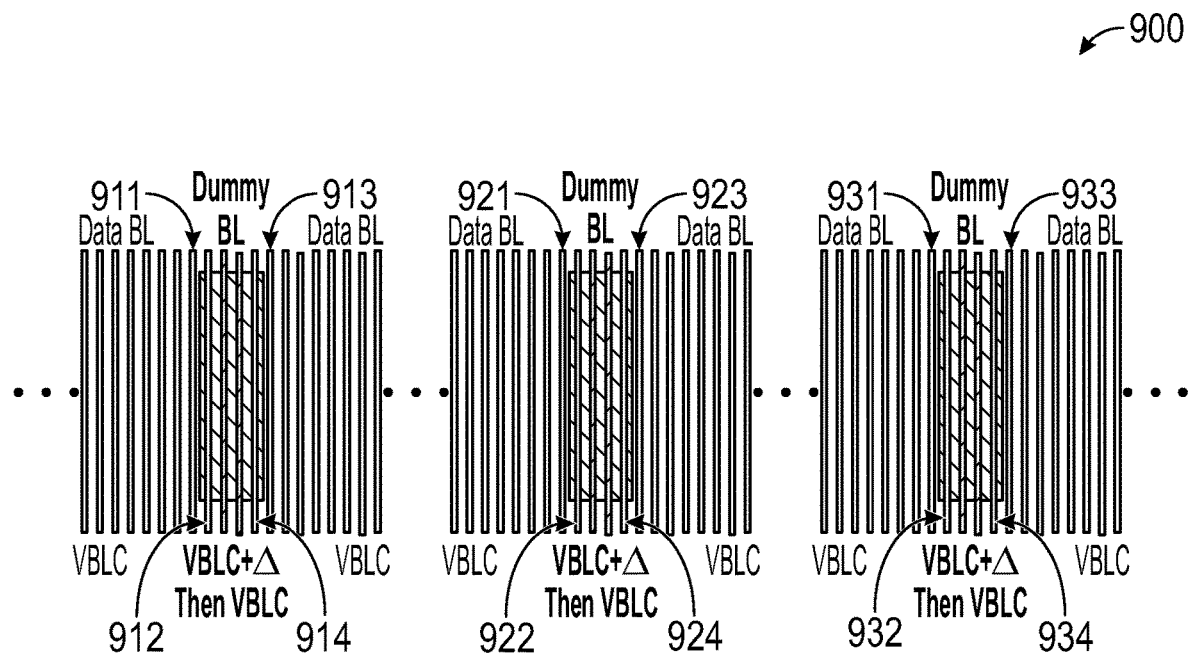
FIGS. 9A and 9B illustrate a second bias scheme of dummy bit lines over shunt.

FIG. 9A illustrates a top view of bit line structures 900 with a second bias scheme of dummy bit lines over shunt, which correspond to those described in FIG. 5A. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The bit line structures 900 corresponds to a portion of the 3D memory structure discussed in FIG. 5A. The bit line structures 900 illustrate three different partitions of the M1 metal layer along with a respective shunt region on the M0 metal layer that is arranged underneath the M1 metal layer. In each different partition, there are sense lines arranged in parallel to dummy lines. For example, in a first partition, dummy lines 912 and 914 are parallel to and in a neighboring location to respective edge data bit lines 911 and 913. In a second partition, dummy lines 922 and 924 are parallel to and in a neighboring location to respective edge data bit lines 921 and 923. In a third partition, dummy lines 932 and 934 are parallel to and in a neighboring location to respective edge data bit lines 931 and 933. Each of the sets of dummy lines is arranged on top of a respective shunt region. Each of the sets of data bit lines is arranged on top of an array of memory cells.

As depicted in FIG. 9A, the dummy bit lines (e.g., 912, 914, 922, 924, 932, 934) are biased with an over-drive/kick voltage (e.g., VBLC+Δ), and then subsequently biased to the same voltage (e.g., VBLC) as the regular data bit lines (e.g., 911, 913, 921, 923, 931, 933). The overdrive voltage applied to the dummy bit line can induce the edge data bit line by accelerating the charge rate of the edge data bit line. This bias scheme can accelerate read speeds such that edge data bit lines operate at a higher rate.

In some implementations, the over-drive voltage consists of the bit line voltage (e.g., VBLC) added with a predetermined delta (Δ). In some examples, the over-drive voltage is greater than the target voltage. The predetermined delta corresponds to a predetermined voltage value that is not more than one half of the target voltage (e.g., VBLC~0.5V).

Figure 9B:
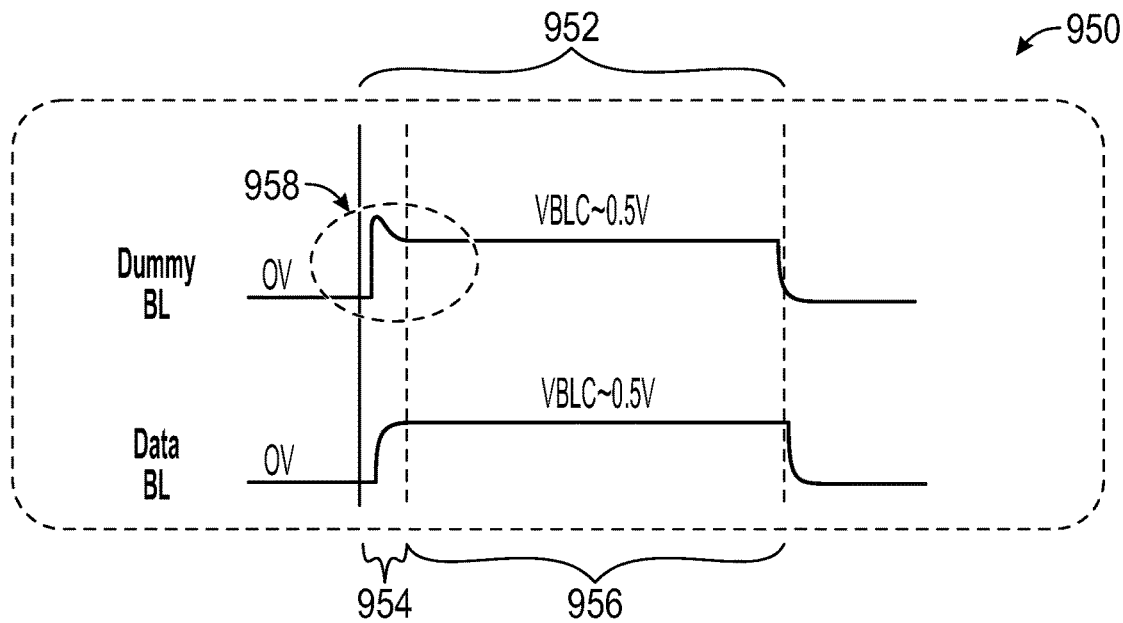

As illustrated in a voltage waveform 950 of FIG. 9B, the dummy bit lines (e.g., 912, 914, 922, 924, 932, 934) above respective shunt regions are first biased at an over-drive voltage (e.g., VBLC+Δ) during a first portion 954 of a period 952. During a second portion 956 of the period 952, the dummy lines and data bit lines are biased at a same rate of charging to a same target voltage. In some implementations, the dummy bit lines and the data bit lines are both biased at the bit line voltage (e.g., VBLC~0.5V) during the second portion 956. During the second portion 956, the applied bias voltage (e.g., VBLC) is kept constant. In some aspects, the length of the first portion 954 is significantly smaller than that of the second portion 956. In one or more aspects, the length of the first portion 954 is no more than 10% of that of the second portion 956.

In some examples, a charge device (e.g., the control circuitry 210) charges a dummy line (e.g., 922) to a first voltage (e.g., VBLC+Δ) during a first portion (e.g., 954) of a period (e.g., 952) and to a second voltage (e.g., VBLC~0.5V) during a second portion (e.g., 956) of the period 952. In some aspects, the second portion 956 contiguously follows the first portion 954. In some implementations, the charge device is configured to charge a data bit line (e.g., 921) without charging the data bit line 921 to the first voltage (e.g., VBLC+Δ) during the first portion 954 of the period 952.

In some examples, the charge device charges the data bit line 921 to a third voltage (e.g., VBLC~0.5V) during at least the second portion 956 of the period 952. In one or more aspects, the third voltage is a same voltage as that of the second voltage (e.g., VBLC~0.5V).

In some implementations, the charge device is configured to charge a data bit line (e.g., 921) at a first charge rate and a dummy line (e.g., 922) at a second charge rate. In one or more examples, the second charge rate is greater than the first charge rate for a duration of the dummy line being charged to the first voltage. In other examples, the charge device is configured to increase a charge rate of the data bit line based on a charge rate of the dummy line for charging the dummy line to the first voltage (e.g., VBLC+Δ). In some aspects, the rate of charging of the data bit line is based on a magnitude and a duration of the over-drive voltage. In this respect, the higher charge rate applied to the dummy line can serve to accelerate a charge rate of the data bit line for a duration of the dummy line being charged to the first voltage (e.g., VBLC+Δ). In some examples, this duration may correspond to the length of the first portion 954 of the period 952.

In other implementations, the dummy bit lines and the data bit lines can both be biased at the source line voltage (e.g., VCELSRC 0V). However, when the bias voltage is 0V, there is no need to bias the dummy bit line with any over-drive voltage (e.g., VBLC+Δ). The dummy bit line may be biased with the over-drive voltage only when the data bit line voltage is greater than 0V (or VBLC>0).

Figure 10:
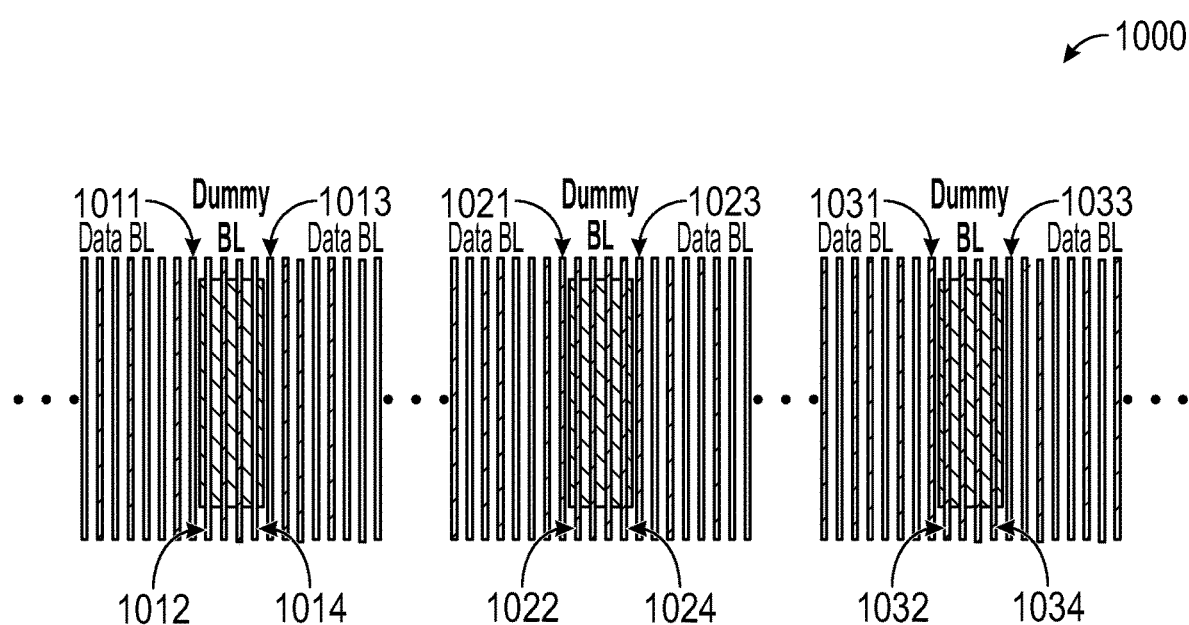
FIG. 10 illustrates a third bias scheme of dummy bit lines over shunt.

FIG. 10 illustrates a top view of bit line structures 1000 with a third bias scheme of dummy bit lines over shunt, which correspond to those described in FIG. 5A. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

As discussed briefly above, the subject technology also provides for increasing the programming speed of edge data bit lines (e.g., bit line settling time) by biasing the dummy bit line the same as its neighboring edge data bit line. For example, if the edge data bit line is in a first state (or logical '1' state), then the dummy bit line can be biased to a rail voltage corresponding to the first state of the edge data bit line, such as VDDSA (e.g., 3V). In another example, if the edge data bit line is in a second state (or logical '0' state), then the dummy bit line can be biased to ground (e.g., 0V) corresponding to the second state of the edge data bit line.

In some implementations, during a program operation, the dummy bit lines are biased identical to the edge data bit line pattern. In some aspects, during the program operation, the dummy bit lines can be first biased with the over-drive/kick voltage (e.g., VBLC+Δ), then biased back to the same voltage as the regular data bit lines. This bias scheme can also accelerate read speeds such that edge data bit lines operate at a higher rate.

As depicted in FIG. 10, the bit line structures 1000 correspond to a portion of the 3D memory structure of FIG. 5A. The bit line structures 1000 illustrate three different partitions of the M1 metal layer along with a respective shunt region on the M0 metal layer that is arranged underneath the M1 metal layer. For example, in a first partition, dummy lines 1012 and 1014 are parallel to and in a neighboring location to respective edge sense lines 1011 and 1013. In a second partition, dummy lines 1022 and 1024 are parallel to and in a neighboring location to respective edge sense lines 1021 and 1023. In a third partition, dummy lines 1032 and 1034 are parallel to and in a neighboring location to respective edge sense lines 1031 and 1033.

In operation, a charge device (e.g., the control circuitry 210) can determine a target state of each of the neighboring sense lines to determine the proper bias levels of the dummy lines. For example, the charge device charges a first dummy line (e.g., 1022) of a plurality of dummy lines to a first target voltage (e.g., VBLC) that is identical to that of a neighboring sense line (e.g., 1021) of the first set of sense lines during the second portion (e.g., 956 of FIG. 9B) of the period (e.g., 952 of FIG. 9B) based on the target state of the neighboring sense line 1021. In one or more implementations, the charge device charges a second dummy line (e.g., 1024) of the plurality of dummy lines to a second target voltage (e.g., VBLC) that is identical to that of a neighboring sense line (e.g., 1023) of the second set of sense lines during the second portion 956 of the period 952 based on the target state of the neighboring sense line 1023.

In some implementations, the charge device charges the first dummy line at an over-drive voltage (e.g., VBLC+Δ) during the first portion (e.g., 954) of the period. In other implementations, the charge device charges the first dummy line at the target voltage during the first and second portions of the period.

In some examples, if the neighboring sense line 1011 is "0" and the neighboring sense line 1013 is "0", then the charge device biases the dummy line 1012 to 0V and the dummy line 1014 to 0V. In another example, if the neighboring sense line 1021 is "1" and the neighboring sense line 1023 is "1", then the charge device biases the dummy line 1022 to 3V and the dummy line 1024 to 3V. In still another example, if the neighboring sense line 1031 is "1" and the neighboring sense line 1033 is "0", then the charge device biases the dummy line 1032 to 3V and the dummy line 1034 to 0V.

Figure 11:
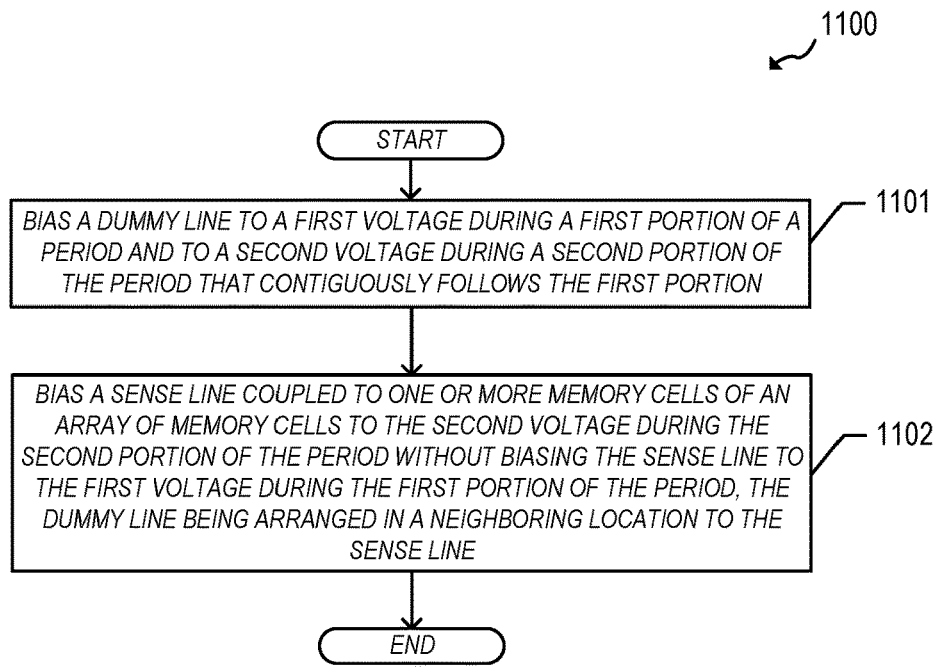
FIG. 11 illustrates an example process of a bias scheme of dummy bit lines over shunt using the example NAND structure of FIG. 5A.

FIG. 11 illustrates an example process 1100 of a bias scheme of dummy bit lines over shunt using the example NAND structure of FIG. 5A. For explanatory purposes, the process 1100 is primarily described herein with reference to the flash memory 112A of the data storage system 100 of FIG. 1. However, the process 1100 is not limited to the flash memory 112A of the data storage system 100 of FIG. 1, and one or more blocks (or operations) of the process 1100 may be performed by one or more other components or circuits of the data storage system 100. The data storage system 100 also is presented as an exemplary device and the operations described herein may be performed by any suitable device, such as one or more of the flash memory circuits 112B-N. Further for explanatory purposes, the blocks of the process 1100 are described herein as occurring in serial, or linearly. However, multiple blocks of the process 1100 may occur in parallel. In addition, the blocks of the process 1100 need not be performed in the order shown and/or one or more blocks of the process 1100 need not be performed and/or can be replaced by other operations.

The process 1100 starts at step 1101, where control circuitry of the flash memory 112A biases a dummy line to a first voltage during a first portion of a period and to a second voltage during a second portion of the period that contiguously follows the first portion. Next, at step 1102, the control circuitry biases a sense line coupled to one or more memory cells of an array of memory cells to the second voltage during the second portion of the period without biasing the sense line to the first voltage during the first portion of the period. In some aspects, the dummy line is arranged in a neighboring location to the sense line.

In some implementations, the process 1100 includes a step for determining a target state of the sense line. In some implementations, the process 1100 includes a step for increasing a voltage on the dummy line to a rail voltage during the second portion of the period when the target state of the sense line corresponds to a high logical state. In some implementations, the process 1100 includes a step for biasing the dummy line to ground during the first portion and the second portion of the period when the target state of the sense line corresponds to a low logical state.

Figure 12:
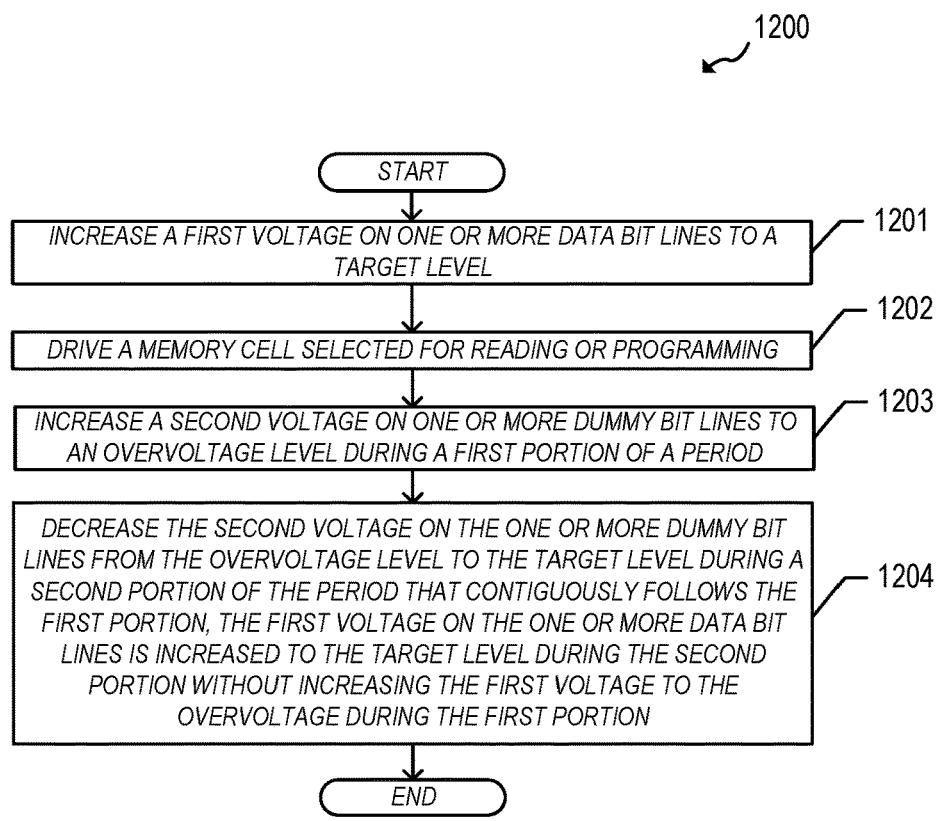
FIG. 12 illustrates another example process of a bias scheme of dummy bit lines over shunt using the example NAND structure of FIG. 5A.

FIG. 12 illustrates an example process 1200 of a bias scheme of dummy bit lines over shunt using the example NAND structure of FIG. 5A. For explanatory purposes, the process 1200 is primarily described herein with reference to the flash memory 122A of the data storage system 100 of FIG. 1. However, the process 1200 is not limited to the flash memory 122A of the data storage system 100 of FIG. 1, and one or more blocks (or operations) of the process 1200 may be performed by one or more other components or circuits of the data storage system 100. The data storage system 100 also is presented as an exemplary device and the operations described herein may be performed by any suitable device, such as one or more of the flash memory circuits 122B-N. Further for explanatory purposes, the blocks of the process 1200 are described herein as occurring in serial, or linearly. However, multiple blocks of the process 1200 may occur in parallel. In addition, the blocks of the process 1200 need not be performed in the order shown and/or one or more blocks of the process 1200 need not be performed and/or can be replaced by other operations.

The process 1200 starts at step 1201, where control circuitry of the flash memory 112A increases a first voltage on one or more data bit lines to a target level. Next, at step 1202, the control circuitry drives a memory cell selected for reading or programming. Subsequently, at step 1203, the control circuitry increases a second voltage on one or more dummy bit lines to an over-drive voltage level during a first portion of a period. Next, at step 1204, the control circuitry decreases the second voltage on the one or more dummy bit lines from the over-drive voltage level to the target level during a second portion of the period that contiguously follows the first portion. In some aspects, the first voltage on the one or more data bit lines is increased to the target level during the second portion of the period without increasing the first voltage to the over-drive voltage level during the first portion of the period.

As discussed above, the subject technology provides for reducing the read-verify and programming latencies by applying a bias scheme dummy bit lines over shunt regions. For example, during a read and verify operation, dummy bit lines can be biased at a same voltage as regular data bit lines (e.g., VBLC). In another example, the dummy bit lines can be first biased with an over-drive/kick voltage (e.g., VBLC+ Δ), then biased back to the same voltage as the regular data bit lines (e.g., VBLC). This bias scheme can accelerate read speeds such that edge data bit lines operate at a higher rate.

In one embodiment of the subject technology, an apparatus includes an array of memory cells, a sense line coupled to one or more cells of the array of memory cells, a dummy line arranged in a neighboring location to the sense line, and a charge device. The charge device is configured to charge the dummy line to a first voltage during a first portion of a period and to a second voltage during a second portion of the period, in which the second voltage is different than the first voltage, and the second portion contiguously follows the first portion. The charge device is also configured to charge the sense line to a third voltage during at least the second portion of the period.

In one embodiment of the subject technology, an apparatus includes an plurality of NAND strings, a set of dummy lines, a set of sense lines coupled to the plurality of NAND strings, and control circuitry. The control circuitry is configured to elevate a voltage on the set of dummy lines beyond a target voltage to an over-drive voltage without elevating a voltage on the set of sense lines to the over-drive voltage during a first period. The control circuitry is also configured to bias the set of dummy lines and the set of sense lines to the target voltage during a second period that contiguously follows the first period to mitigate a capacitive coupling between the set of sense lines and the set of dummy lines during a period that includes the second period.

In one embodiment of the subject technology, a system includes an array of memory cells for programming, a plurality of bit lines coupled to one or more memory cells of the array of memory cells, a first dummy line arranged adjacent to a first bit line of the plurality of bit lines, a second dummy line arranged adjacent to a second bit line of the plurality of bit lines, and a controller coupled to the one or more memory cells of the array of memory cells. In some aspects, when a memory cell of the array of memory cells is selected for a data storage operation, the controller is configured to charge the first dummy line to a first voltage during a first duration and to a second voltage corresponding to a target data state of the first bit line during a second duration that contiguously follows the first duration. In some aspects, the second voltage is lesser than the first voltage. The controller is also configured to charge the first bit line to the second voltage during the second duration, and charge the second dummy line to a third voltage during the first duration and to a fourth voltage corresponding to a target data state of the second bit line during the second duration. In some aspects, the fourth voltage is lesser than the third voltage. The controller is also configured to charge the second bit line to the fourth voltage during the second duration.

In one embodiment of the subject technology, a method includes biasing a dummy line to a first voltage during a first portion of a period and to a second voltage during a second portion of the period that contiguously follows the first portion. The method also includes biasing a sense line coupled to one or more memory cells of an array of memory cells to the second voltage during the second portion of the period without biasing the sense line to the first voltage during the first portion of the period. The dummy line is arranged in a neighboring location to the sense line.

In one embodiment of the subject technology, a non-volatile memory includes means for increasing a first voltage on one or more data bit lines to a target level. The non-volatile memory includes means for driving a memory cell selected for reading or programming. The non-volatile memory includes means for increasing a second voltage on one or more dummy bit lines to an over-drive voltage level during a first portion of a period. The non-volatile memory also includes means for decreasing the second voltage on the one or more dummy bit lines from the over-drive voltage level to the target level during a second portion of the period that contiguously follows the first portion. In some aspects, the one or more dummy bit lines are arranged in neighboring locations to the one or more data bit lines. In some aspects, the means for increasing the first voltage to the target level comprises means for increasing the first voltage to the target level during the second portion of the period without increasing the first voltage to the over-drive voltage level during the first portion of the period.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an implementation, the implementation, another implementation, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any implementation described herein as "exemplary" or as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus, comprising:
   an array of memory cells;
   a sense line coupled to one or more cells of the array of memory cells;
   a dummy line arranged in a neighboring location to the sense line; and
   a charge device configured to:
     charge the dummy line to a first voltage during a first portion of a period and to a second voltage during a second portion of the period, wherein the second voltage is different than the first voltage, and wherein the second portion contiguously follows the first portion; and
     charge the sense line to a voltage that is less than the first voltage throughout the first portion of the period, and to a third voltage during at least the second portion of the period.

2. The apparatus of claim 1, wherein the charge device is configured not to charge the sense line to the first voltage during the first portion of the period.

3. The apparatus of claim 1, wherein the first voltage is greater than the second voltage.

4. The apparatus of claim 1, wherein the third voltage is a same voltage as that of the second voltage.

5. The apparatus of claim 1, wherein the charge device is configured to charge the sense line at a first charge rate and the dummy line at a second charge rate, wherein the second charge rate is greater than the first charge rate for a duration of the dummy line being charged to the first voltage.

6. The apparatus of claim 1, wherein the charge device is configured to accelerate a charge rate of the sense line for a duration of the dummy line being charged to the first voltage.

7. The apparatus of claim 1, wherein the charge device is configured to increase a charge rate of the sense line based on a charge rate of the dummy line for charging the dummy line to the first voltage.

8. The apparatus of claim 1, wherein the dummy line is arranged on a layer that is on a same plane as a layer containing the sense line.

9. The apparatus of claim 1, wherein the dummy line is interposed between a plurality of sense lines including the sense line.

10. The apparatus of claim 1, wherein a difference between the first voltage and the second voltage is not more than one half of the second voltage.

11. The apparatus of claim 1, wherein the second voltage is constant during the second portion of the period.

12. The apparatus of claim 1, wherein the charge device is configured to determine a target state of the sense line, wherein the charge device is configured to charge the dummy line to a first target voltage during the second portion of the period when the sense line is in a first target state, and wherein the charge device is configured to charge the dummy line to a second target voltage during the second portion of the period when the sense line is in a second target state.

13. The apparatus of claim 1, further comprising:
   a plurality of dummy lines that includes the dummy line;
   a first set of sense lines; and
   a second set of sense lines,
   wherein the plurality of dummy lines is interposed between the first set of sense lines and the second set of sense lines,
   wherein the charge device is configured to charge a first dummy line of the plurality of dummy lines to a first target voltage that is identical to that of a neighboring sense line of the first set of sense lines during the second portion of the period, and
   wherein the charge device is configured to charge a second dummy line of the plurality of dummy lines to a second target voltage that is identical to that of a neighboring sense line of the second set of sense lines during the second portion of the period.

14. The apparatus of claim 1, further comprising:
   a shunt structure for delivering a source line voltage to the one or more cells of the array of memory cells, wherein the dummy line is coupled to the shunt structure via one or more isolation layers interposed between a layer containing the dummy line and a layer containing the shunt structure.

15. An apparatus, comprising:
   a plurality of NAND strings;
   a set of dummy lines;
   a set of sense lines coupled to the plurality of NAND strings; and
   control circuitry configured to:
     elevate a voltage on the set of dummy lines beyond a target voltage to an over-drive voltage without elevating a voltage on the set of sense lines to the over-drive voltage during a first period, and bias the set of dummy lines and the set of sense lines to the target voltage during a second period that contiguously follows the first period to mitigate a capacitive coupling between the set of sense lines and the set of dummy lines during a period that includes the second period.

16. The apparatus of claim 15, wherein the set of dummy lines comprises sense lines positioned above a shunt structure configured to deliver a source line voltage to the plurality of NAND strings, and wherein the set of dummy lines is interposed between sets of sense lines.

17. The apparatus of claim 15, wherein the over-drive voltage is not more than one half of the target voltage.

18. The apparatus of claim 17, wherein the control circuitry is configured to increase the voltage on a neighboring dummy line of the set of dummy lines during the first period at a charge rate that accelerates a charge rate of a sense line of the set of sense lines that is adjacent to the neighboring dummy line according to a magnitude and a duration of the over-drive voltage.

19. A system, comprising:
an array of memory cells for programming;
a plurality of bit lines coupled to one or more memory cells of the array of memory cells;
a first dummy line arranged adjacent to a first bit line of the plurality of bit lines;
a second dummy line arranged adjacent to a second bit line of the plurality of bit lines; and
a controller coupled to the one or more memory cells of the array of memory cells, wherein when a memory cell of the array of memory cells is selected for a programming operation, the controller is configured to:
charge the first dummy line to a first voltage during a first duration and to a second voltage corresponding to a target data state of the first bit line during a second duration that contiguously follows the first duration, the second voltage being lesser than the first voltage;
charge the first bit line to the second voltage during the second duration;
charge the second dummy line to a third voltage during the first duration and to a fourth voltage corresponding to a target data state of the second bit line during the second duration, the fourth voltage being lesser than the third voltage; and
charge the second bit line to the fourth voltage during the second duration.

20. The system of claim 19, wherein the controller is configured to charge the first dummy line without charging the first bit line to the first voltage during the first duration and charge the second dummy line without charging the second bit line to the third voltage during the first duration.

* * * * *